(12) United States Patent
Suzuki

(10) Patent No.: US 10,913,601 B2
(45) Date of Patent: Feb. 9, 2021

(54) TEMPORARY STORAGE SYSTEM

(71) Applicant: Murata Machinery, Ltd., Kyoto (JP)

(72) Inventor: Takashi Suzuki, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/080,138

(22) PCT Filed: Jan. 24, 2017

(86) PCT No.: PCT/JP2017/002317
§ 371 (c)(1),
(2) Date: Aug. 27, 2018

(87) PCT Pub. No.: WO2017/150006
PCT Pub. Date: Sep. 8, 2017

(65) Prior Publication Data
US 2019/0047786 A1 Feb. 14, 2019

(30) Foreign Application Priority Data

Mar. 3, 2016 (JP) .................................. 2016-041533

(51) Int. Cl.
*B65G 1/04* (2006.01)
*H01L 21/677* (2006.01)

(52) U.S. Cl.
CPC ......... *B65G 1/0464* (2013.01); *B65G 1/0414* (2013.01); *B65G 1/0492* (2013.01);
(Continued)

(58) Field of Classification Search
CPC .. B65G 1/0414; B65G 1/0464; B65G 1/0492; B65G 1/0457; B65G 1/065; B65G 1/02;
(Continued)

(56) References Cited

U.S. PATENT DOCUMENTS 3,385,458 A * 5/1968 Gresham ................. B63C 15/00
414/283
7,850,412 B2 * 12/2010 Benedict ................. B63C 15/00
114/44
(Continued)

FOREIGN PATENT DOCUMENTS

CN 105236061 A 1/1916
CN 101148206 A 3/2008
(Continued)

OTHER PUBLICATIONS

The First Office Action dated Aug. 22, 2019, of counterpart Chinese Application No. 201780013819.3, along with English translation.

*Primary Examiner* — Glenn F Myers
(74) *Attorney, Agent, or Firm* — DLA Piper LLP (US)

(57) ABSTRACT

A temporary storage system includes a travel rail having first rails and second rails, the first rails and the second rails being disposed in a grid pattern on a same plane and disposed to surround a transfer port for receiving an article in a two-dimensional view; a vehicle having a travel part and a transfer part including an elevator; and storages each configured to store the article, in which the travel rail is disposed such that the vehicle is accessible to a stop position where the transfer part is disposed immediately above the transfer port from a side with the storage for the transfer port and the vehicle is accessible to another stop position where the transfer part is disposed immediately above the storage.

3 Claims, 19 Drawing Sheets

(52) U.S. Cl.
CPC .... *H01L 21/6773* (2013.01); *H01L 21/67727* (2013.01); *H01L 21/67733* (2013.01); *H01L 21/67736* (2013.01); *B65G 2201/0297* (2013.01)

(58) Field of Classification Search
CPC . B65G 1/022; B65G 1/0478; H01L 21/67733; H01L 21/6773; H01L 21/67736; H01L 21/67739; B65D 88/02; B65D 88/022
USPC .......................................................... 414/281
See application file for complete search history.

(56) References Cited

U.S. PATENT DOCUMENTS

| | | | |
|---|---|---|---|
| 9,073,691 B2* | 7/2015 | Morimoto | H01L 21/67733 |
| 9,548,230 B2* | 1/2017 | Iwasaki | H01L 21/67733 |
| 9,796,080 B2* | 10/2017 | Lindbo | B65G 1/065 |
| 10,037,908 B2* | 7/2018 | Ota | H01L 21/67259 |
| 10,189,641 B2* | 1/2019 | Hognaland | B65G 1/0464 |
| 2006/0182553 A1* | 8/2006 | Yamamoto | B65G 47/5104 |
| | | | 414/278 |
| 2007/0224026 A1 | 9/2007 | Chang | |
| 2010/0239400 A1* | 9/2010 | Ishikawa | B65G 37/02 |
| | | | 414/373 |
| 2010/0278622 A1* | 11/2010 | Huang | B66F 19/00 |
| | | | 414/673 |
| 2010/0290872 A1 | 11/2010 | Bonora et al. | |
| 2012/0275886 A1 | 11/2012 | Ota | |
| 2013/0058743 A1 | 3/2013 | Rebstock | |
| 2015/0332948 A1 | 11/2015 | Ikeda et al. | |
| 2016/0126120 A1* | 5/2016 | Oza | G05B 19/4189 |
| | | | 700/121 |
| 2016/0145058 A1* | 5/2016 | Lindbo | B65G 57/302 |
| | | | 700/218 |
| 2016/0247701 A1 | 8/2016 | Rebstock | |
| 2017/0233187 A1 | 8/2017 | Fukushima | |
| 2018/0148259 A1* | 5/2018 | Gravelle | B65G 1/04 |

FOREIGN PATENT DOCUMENTS

| | | |
|---|---|---|
| CN | 10394967 A | 7/2014 |
| JP | 11-189313 A | 7/1999 |
| JP | 2007-17326 A | 1/2007 |
| JP | 2012-111635 A | 6/2012 |
| WO | 2014/090684 A1 | 6/2014 |
| WO | 2014/203126 A1 | 12/2014 |
| WO | 2015/019055 A1 | 2/2015 |
| WO | 2015/174181 A1 | 11/2015 |
| WO | 2016/039023 A1 | 3/2016 |

* cited by examiner

TEMPORARY STORAGE SYSTEM

TECHNICAL FIELD

This disclosure relates to a temporary storage system.

BACKGROUND

A system described in Japanese Unexamined Patent Publication No. 2012-111635 is known as a conventional temporary storage system. The transport system described in Japanese Unexamined Patent Publication No. 2012-111635 includes: a first track that passes above loading ports of processing devices; an overhead traveling vehicle traveling along the first track and including a hoist; a second track under and in parallel or substantially parallel to the first track, the second track passing above the load ports; a buffer for placement of the article, the buffer being provided under the second track at a position higher than the loading port, and being arranged to allow the article to pass in a vertical direction over the loading port; and a local vehicle traveling along the second track and including a hoist to perform delivery and receipt of the article between the buffer and the loading port.

Unfortunately, to increase the number of buffers, it is necessary to extend the second rail, and as the number of buffers increases, the distance of buffers at both ends in the lengthwise direction of the second rail from the loading port increases. In other words, it is difficult to temporarily store many articles in the vicinity of the loading port.

It could therefore be helpful to provide a temporary storage system capable of temporarily storing many articles at a position from which an article can be conveyed faster to a transfer port by vehicle.

SUMMARY

I thus provide:

A temporary storage system includes a travel rail having a plurality of first rails extending linearly in a first direction and a plurality of second rails extending in a second direction orthogonal to the first direction, the first rails and the second rails being disposed in a grid pattern on a same plane and disposed to surround a transfer port for receiving an article in a two-dimensional view; a vehicle having a travel part configured to travel on the travel rail in the first direction and the second direction and a transfer part including a holder configured to hold the article and an elevator configured to elevate and lower the holder; and a plurality of storages each configured to store the article, in which the travel rail is disposed such that the vehicle is accessible to a first stop position where the transfer part is disposed immediately above the transfer port from a side with the storage for the transfer port and the vehicle is accessible to a second stop position where the transfer part is disposed immediately above the storage.

The travel rail may surround the transfer port for receiving an article in a two-dimensional view. The travel rail is disposed such that the vehicle is accessible to a first stop position where the transfer part is disposed immediately above the transfer port from the side with the storage for the transfer port and the vehicle is accessible to a second stop position where the transfer part is disposed immediately above the storage. With this configuration, in the temporary storage system, many articles can be temporarily stored at a position from which an article can be conveyed to the transfer port faster by the vehicle.

The vehicle may travel on the travel rail with the transfer part positioned above the travel rail, the travel rail may have an opening in a region covering the transfer port in a two-dimensional view, and the vehicle may transfer the article to the transfer port using the transfer part through the opening. With this configuration of the vehicle traveling on the travel rail with the transfer part positioned above the travel rail, the vehicle can transfer the article to the transfer port even when the travel rail is provided to surround the transfer port in a two-dimensional view.

The first rails and the second rails of the travel rail may be respectively disposed with spacing to enable the article to pass through in a vertical direction, the storage may be disposed immediately below a space defined by the first rail and the second rail, and the vehicle may transfer the article to the storage using the transfer part through the space. In this configuration of the vehicle traveling on the travel rail with the transfer part positioned above the travel rail, many articles can be stored at a position that does not obstruct traveling of the vehicle.

The transfer port may be a load port provided at a processing device, and the opening may have a region covering a plurality of the transfer ports provided at the processing device. This configuration ensures the degree of freedom of relative position between the travel rail and the transfer port in a two-dimensional view.

The transfer part may have a movable part configured to advance and retract the elevator in a direction parallel to a plane along the first direction and the second direction, and the vehicle may stop on at least one of the first rail and the second rail forming the opening and advance the movable part to transfer the article to the transfer port through the opening. In this configuration, the region of the opening can be increased. Accordingly, the degree of freedom of relative position between the travel rail and the transfer port in a two-dimensional view can be ensured.

The travel rail may be provided with a detection target at a stop position of the vehicle for the transfer port. The vehicle may include a detector configured to detect the detection target. The travel part may stop at the stop position, based on a result of detection by the detector. In this configuration, the vehicle can stop accurately at the stop position.

The travel rail may be disposed such that the vehicle is stoppable immediately above the transfer port, and the vehicle may stop immediately above the transfer port and transfer the article to the transfer port through the opening. In this configuration, the article can be transferred quickly to the transfer port.

The vehicle may travel on the travel rail with the transfer part positioned below the travel rail. In this configuration, the article can be transferred to the transfer port without providing an opening in the travel rail.

The travel rail may be provided with a detection target at a stop position of the vehicle for the transfer port, the vehicle may include a detector configured to detect the detection target, and the travel part may stop the vehicle at the stop position, based on a result of detection by the detector. In this configuration, the vehicle can stop accurately at the stop position for the transfer port.

Thus, many articles can be temporarily stored at a position from which an article can be conveyed faster to the transfer port by vehicle.

REFERENCE SIGNS LIST

4 . . . travel rail, 6 . . . buffer, 8 . . . vehicle, 9 . . . first rail, 11 . . . second rail, 22 . . . cell buffer (storage), 24 . . . travel part, 26 . . . transfer part, 38 . . . barcode reader (detector), 40 . . . slide fork (movable part), 45 . . . elevating device (elevator), 46A . . . gripper (holder), 50 . . . FOUP (article), 100 . . . conveyance system (temporary storage system), B . . . barcode (detection target), P1 to P9 . . . first to ninth load ports.

DETAILED DESCRIPTION

Preferred examples will be described in detail below with reference to the accompanying drawings. In the description of the drawings, the same or corresponding elements will be denoted by the same reference signs and an overlapping description will be omitted.

Figure 1:
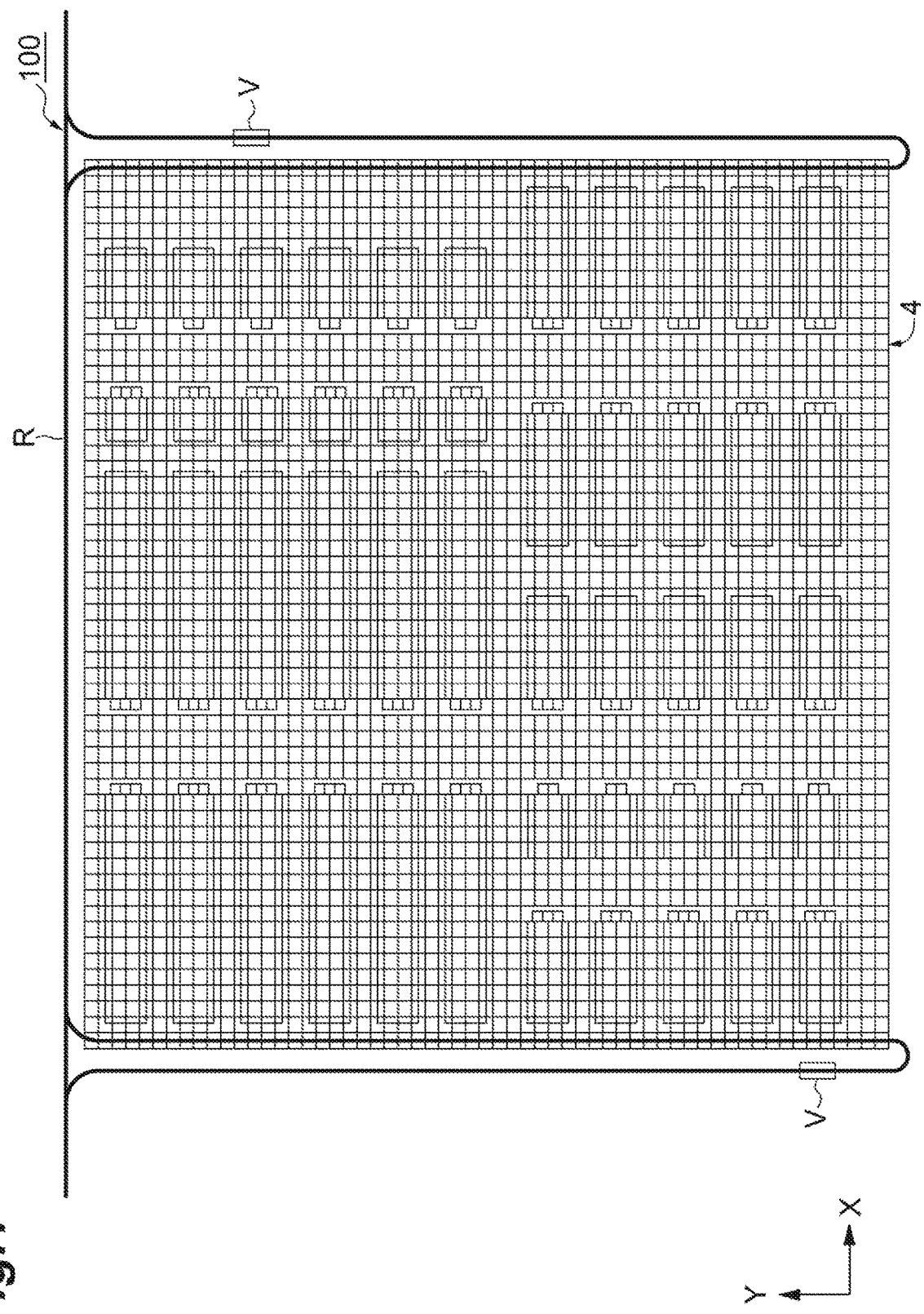
FIG. 1 is a plan view of a conveyance system including a temporary storage system according to an example.

A conveyance system 100 illustrated in FIG. 1 is, for example, a system that conveys a cassette accommodating substrates such as a plurality of semiconductor wafers in a clean room of a semiconductor fab equipped with a plurality of processing devices. The cassette is a carrier (article) intended for conveyance and storage of semiconductor wafers, and examples thereof include front opening unified pod (FOUP), front opening shipping box (FOSB), and SMIFPod. A conveyance system that conveys a FOUP 50 will be described by way of example. The FOUP 50 includes a body 51, a lid 52 attached to the opening of the body 51, and a flange 53 provided at the top of the body 51. The conveyance system 100 also has the function as a temporary storage system for temporarily storing the FOUP 50.

Figure 2:
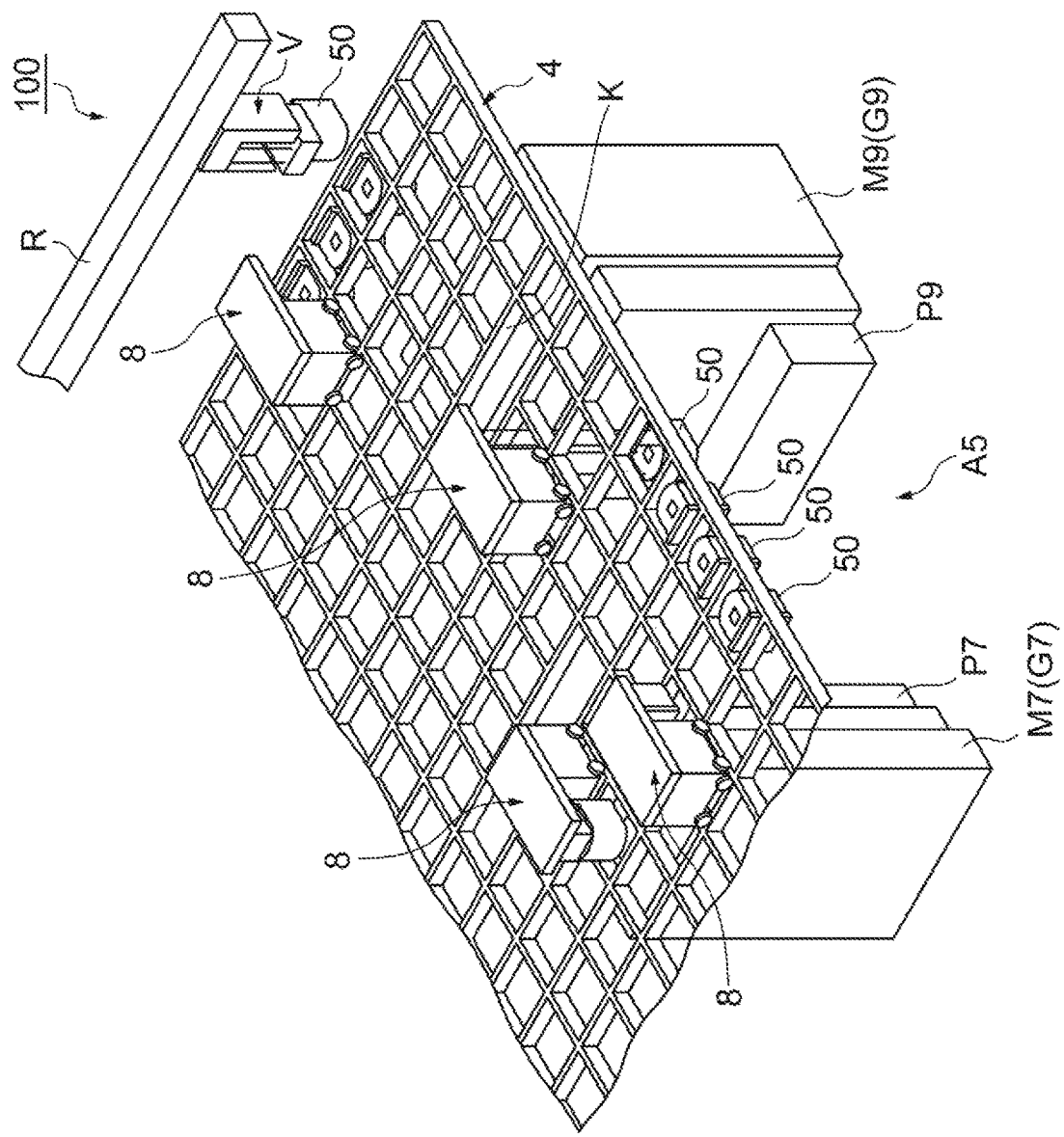
FIG. 2 is a perspective view of part of the conveyance system illustrated in FIG. 1.

As illustrated in FIGS. 1 and 2, the conveyance system 100 includes a travel rail 4, vehicles 8 traveling on the travel rail 4, a track R, and overhead transport vehicles V traveling on the track R. The track R is installed in the vicinity of the ceiling of a clean room. The track R is provided across the conveyance system 100 and another conveyance system. Part of the track R is disposed above the travel rail 4. That is, each of the overhead transport vehicles V travels above the travel rail 4. When both of the destination and the source of the FOUP 50 are immediately below the track R, the overhead transport vehicle V can convey the FOUP 50 faster than the vehicle 8 traveling on the travel rail 4 does. Therefore, in such a condition, the overhead transport vehicle V is used to convey the FOUP 50 that needs to be conveyed faster than conveyance with the vehicle 8. The track R may be provided at the same height as the travel rail 4 or below the travel rail 4.

The overhead transport vehicle V is an over head transfer (OHT). The overhead transport vehicle V conveys a FOUP 50 to a cell buffer 22 (which will be described later) provided on the travel rail 4 and picks up the FOUP 50 from the cell buffer 22 to convey the FOUP 50 to another conveyance system.

Figure 3:
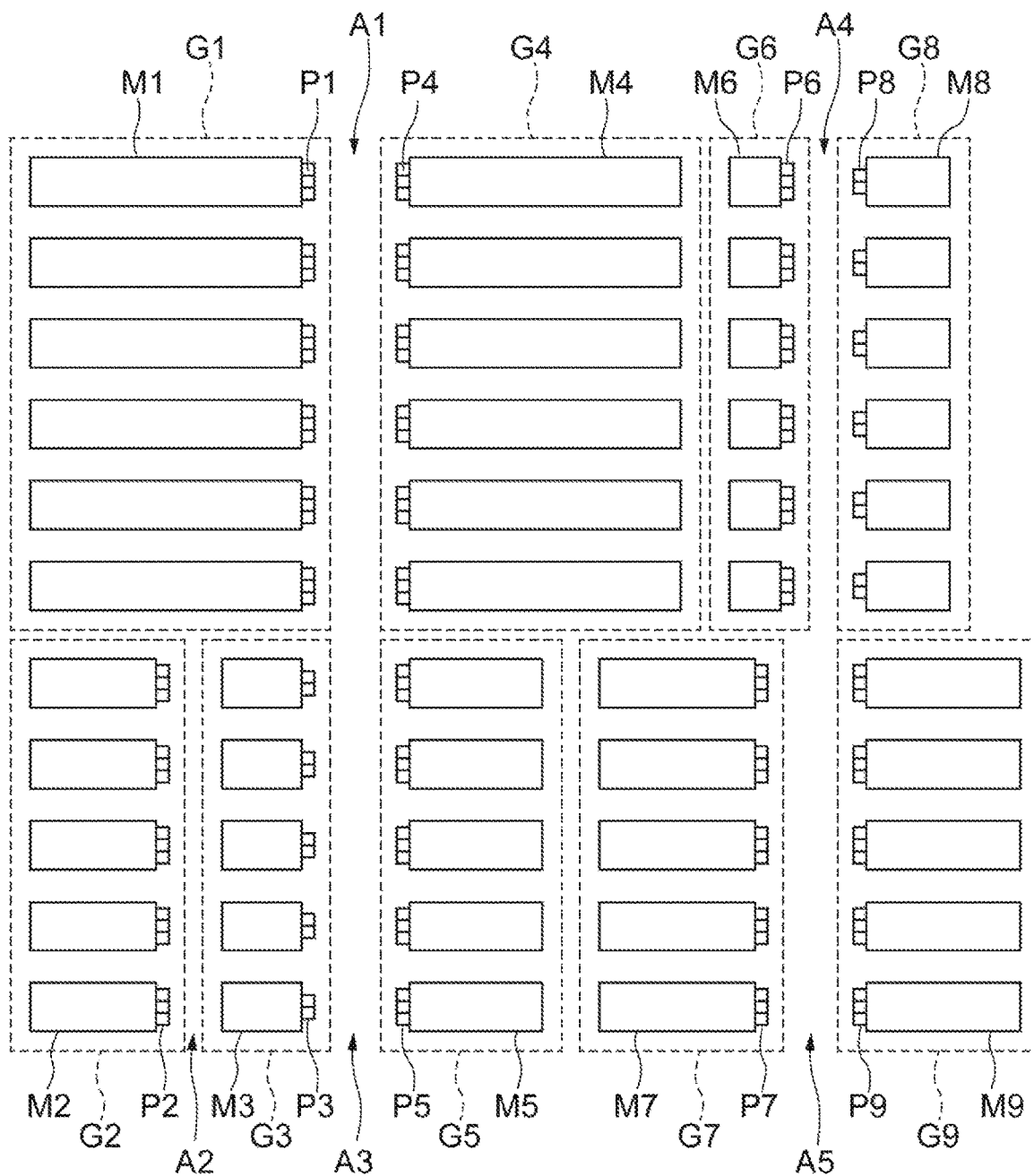
FIG. 3 is a diagram illustrating processing devices provided below a travel rail of the conveyance system illustrated in FIG. 1.

As illustrated in FIG. 1, processing devices are provided below the travel rail 4. Specifically, as illustrated in FIG. 3, provided below the travel rail 4 are a first processing device group G1 having a plurality of first processing devices M1, a second processing device group G2 having a plurality of second processing devices M2, a third processing device group G3 having a plurality of third processing devices M3, a fourth processing device group G4 having a plurality of fourth processing devices M4, a fifth processing device group G5 having a plurality of fifth processing devices M5, a sixth processing device group G6 having a plurality of sixth processing devices M6, a seventh processing device group G7 having a plurality of seventh processing devices M7, an eighth processing device group G8 having a plurality of eighth processing devices M8, and a ninth processing device group G9 having a plurality of ninth processing devices M9. The first processing device group G1 to the ninth processing device group G9 each perform processing in a step (manufacturing process) for semiconductor manufacturing. The first processing device group G1 to the ninth processing device group G9 perform, for example, film deposition on a semiconductor wafer and cleaning of a semiconductor wafer. The processing for semiconductor manufacturing is not completed in a single processing device group and, after processing is performed in one processing device group, processing is performed in another processing device group.

The first processing device group G1 and the second processing device group G2 are disposed adjacent to each other in the Y direction. The first processing device group G1 and the third processing device group G3 are disposed adjacent to each other in the Y direction. The first processing device group G1 and the fourth processing device group G4 are disposed adjacent to each other in the X direction. The fourth processing device group G4 and the fifth processing device group G5 are disposed adjacent to each other in the Y direction. The third processing device group G3 and the fifth processing device group G5 are disposed adjacent to each other in the X direction. The fourth processing device group G4 and the seventh processing device group G7 are disposed adjacent to each other in the Y direction. The fourth processing device group G4 and the sixth processing device group G6 are disposed adjacent to each other in the X direction. The sixth processing device group G6 and the seventh processing device group G7 are disposed adjacent to each other in the Y direction. The sixth processing device group G6 and the eighth processing device group G8 are disposed adjacent to each other in the X direction. The eighth processing device group G8 and the ninth processing device group G9 are disposed adjacent to each other in the Y direction. The seventh processing device group G7 and the ninth processing device group G9 are disposed adjacent to each other in the X direction.

The first to ninth processing devices M1 to M9 may be devices that perform the same processing on semiconductor wafers or may be devices that perform different processing. The number of first to ninth processing devices M1 to M9 may be set as appropriate depending on the design.

The first processing device M1 has a first load port (transfer port) (hereinafter simply referred to as "load port") P1, which is an interface for loading and unloading a semiconductor wafer in the FOUP 50 into/from the first processing device M1. The first processing device M1 has, for example, three first load ports P1. The second processing device M2 has a second load port P2. The third processing device M3 has a third load port P3. The fourth processing device M4 has a fourth load port P4. The fifth processing device M5 has a fifth load port P5. The sixth processing device M6 has a sixth load port P6. The seventh processing device M7 has a seventh load port P7. The eighth processing device M8 has an eighth load port P8. The ninth processing device M9 has a ninth load port P9. The number of first to ninth load ports P1 to P9 in the first to ninth processing devices M1 to M9 may be set as appropriate.

In the first processing device group G1, the first processing devices M1 are disposed with predetermined spacing in the Y direction. The first load ports P1 are disposed along the Y direction. Similarly, in the second to ninth processing device groups G2 to G9, the second to ninth processing devices M2 to M9 are disposed with predetermined spacing in the Y direction. The second to ninth load ports P2 to P9 are disposed along the Y direction.

The first processing device M1 in the first processing device group G1 and the fourth processing device M4 in the fourth processing device group G4 are disposed such that the first load port P1 and the fourth load port P4 are opposed to each other. An aisle A1 is provided between the first load port P1 and the fourth load port P4. The aisle A1 has a width, for example, that allows operators to walk through. An aisle A2 is provided between the second processing device group G2 and the third processing device group G3. An aisle A3 is provided between the third processing device group G3 and the fifth processing device group G5. An aisle A4 is provided between the sixth processing device group G6 and the eighth processing device group G8. An aisle A5 is provided between the seventh processing device group G7 and the ninth processing device group G9.

Figure 4:
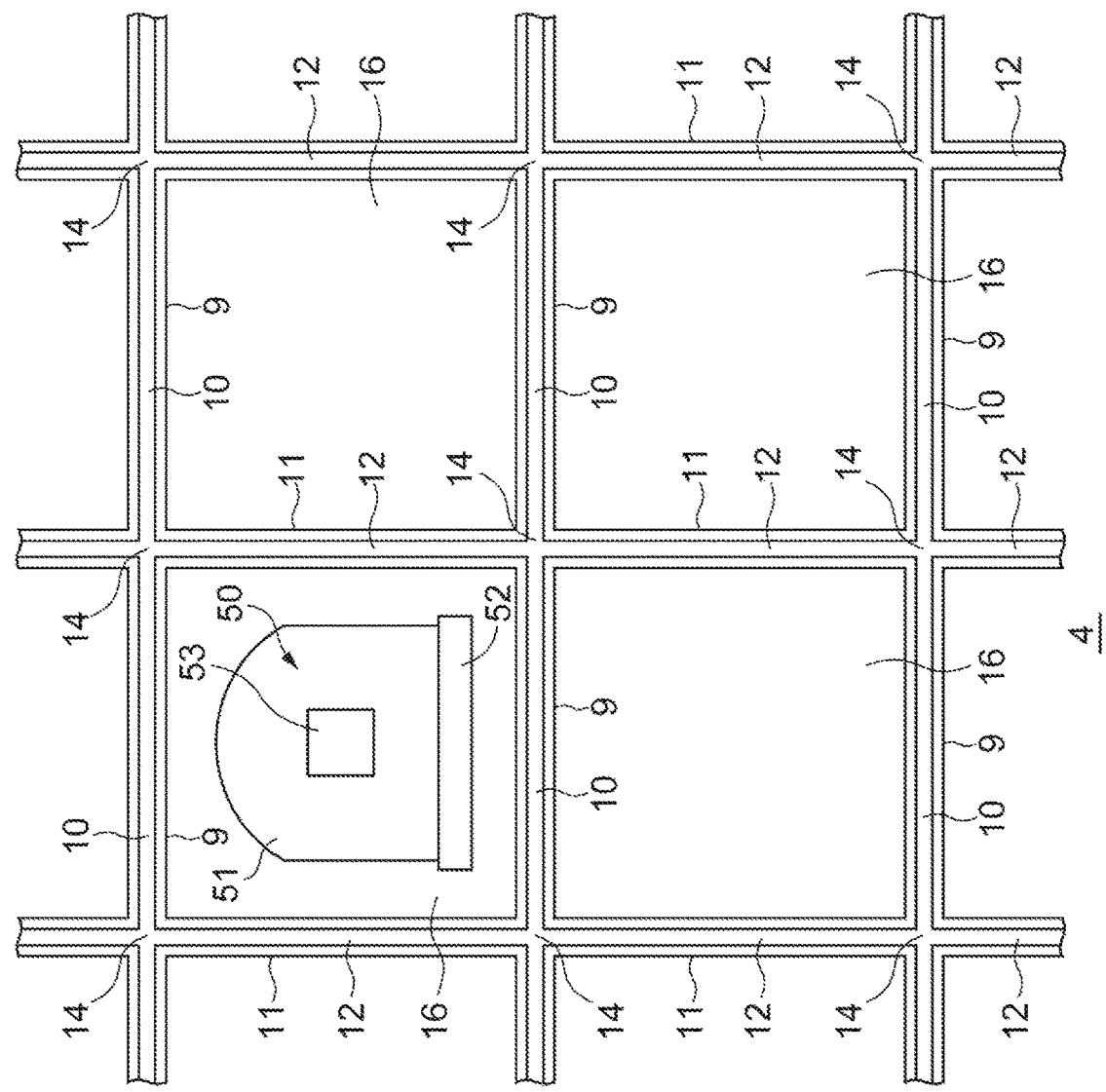
FIG. 4 is a diagram illustrating the travel rail.

As illustrated in FIGS. 1 and 2, the travel rail 4 is provided in a grid pattern in a two-dimensional view. The travel rail 4 is supported, for example, on struts (not illustrated) on the ceiling of the clean room. As illustrated in FIG. 4, the travel rail 4 includes a plurality of first rails 9 and a plurality of second rails 11.

Each of the first rails 9 extends linearly in the X direction (first direction). The first rail 9 is provided with a guide 10. The guide 10 is a groove and provided along the lengthwise direction of the first rail 9. Each of the second rails 11 extends linearly in the Y direction (second direction) orthogonal to the X direction in which the first rail 9 extends.

The second rail 11 is provided with a guide 12. The guide 12 is a groove and provided along the lengthwise direction of the second rail 11. A cross point 14 is provided at a section where the guide 10 of the first rail 9 intersects the guide 12 of the second rail 11.

Figure 5:
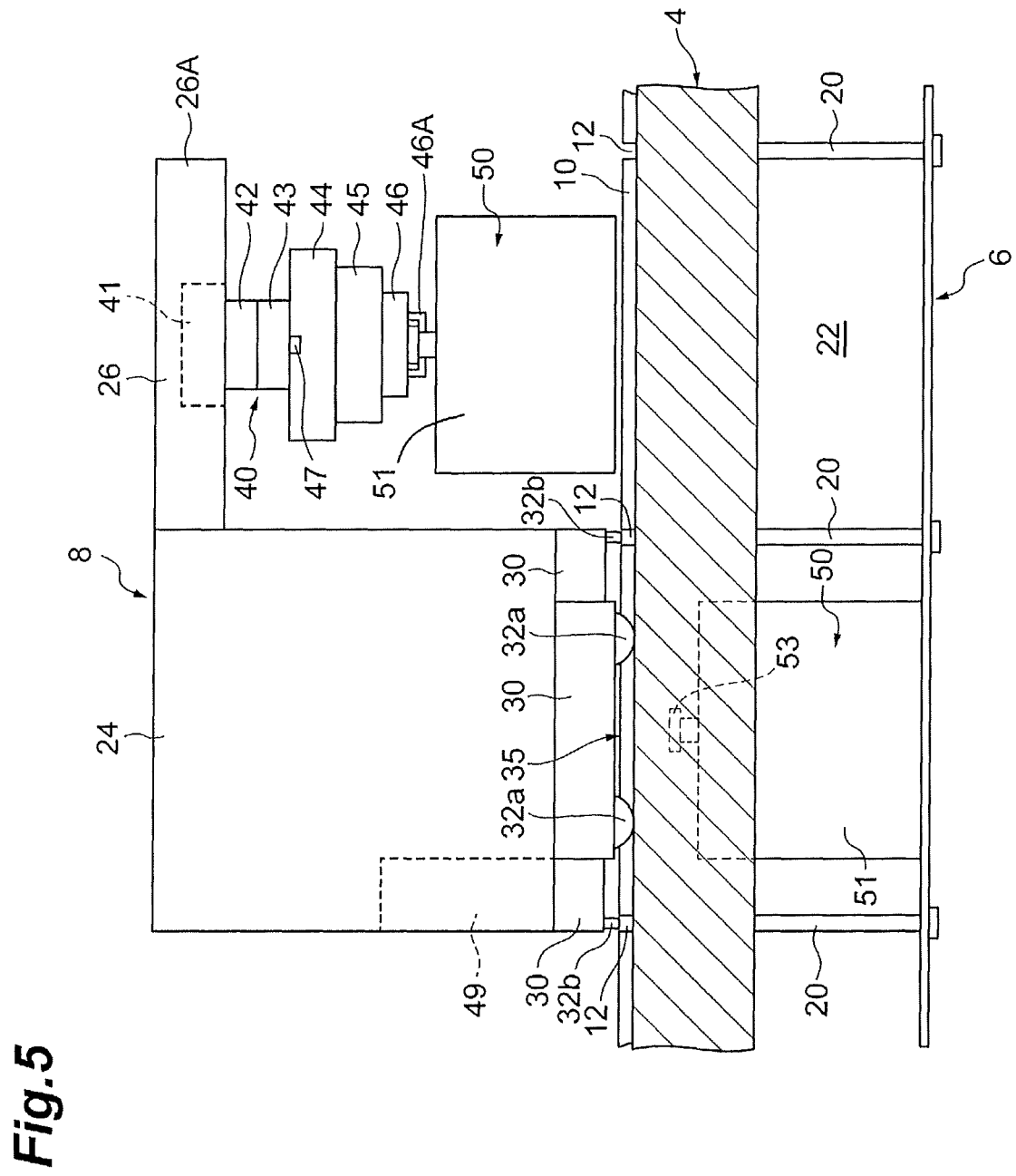
FIG. 5 is a diagram illustrating a vehicle.

As illustrated in FIG. 5, a buffer 6 is provided below the travel rail 4 and above the first to ninth processing devices M1 to M9. The buffer 6 is a shelf in which a FOUP 50 is placed and accommodates a FOUP 50. The buffer 6 is supported by support members 20 on the travel rail 4. The buffer 6 includes a plurality of cell buffers (storages) 22. The cell buffer 22 is set for each rectangular cell (space) 16 defined by the first rail 9 and the second rail 11 in the travel rail 4. The cell buffers 22 each store one FOUP 50. A FOUP 50 is transferred to the cell buffer 22 through the cell 16. That is, a FOUP 50 passes through the cell 16 in the vertical direction and is transferred to the cell buffer 22. As illustrated in FIG. 5, the buffer 6 is provided at a position where part of the FOUP 50 placed on the buffer 6 overlaps the travel rail 4 in a side view.

As illustrated in FIGS. 2 and 5, a vehicle 8 is provided on the travel rail 4. A plurality of vehicles 8 are provided on the travel rail 4. The vehicle 8 includes a travel part 24 and a transfer part 26. The vehicle 8 further includes a control unit controlling the operation of the travel part 24 and the transfer part 26 and a communication unit capable of communication with a host controller. The control unit is, for example, an electronic control unit including a central processing unit (CPU), a read only memory (ROM), and a random access memory RAM). The vehicle 8 conveys a FOUP 50 under an instruction from the host controller.

Figure 6:
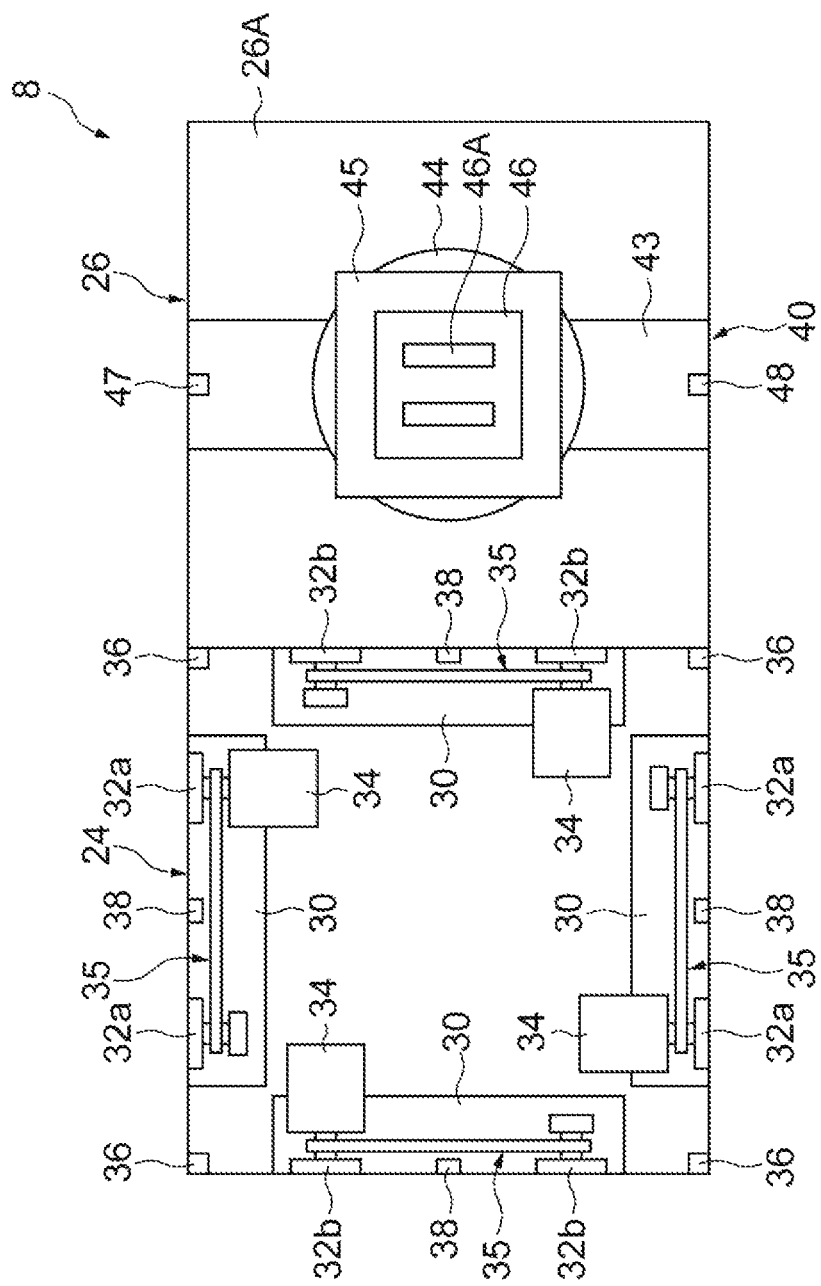
FIG. 6 is a diagram illustrating the vehicle as viewed from the bottom side.

The travel part 24 has a rectangular parallelepiped shape. The travel part 24 has a size equivalent to a cell 16 in a two-dimensional view. As illustrated in FIG. 6, the travel part 24 has a plurality of (four in this example) travel units 35. Each travel unit 35 has a plurality of (two in this example) wheels 32a or wheels 32b, a travel motor 34, and an up and down mechanism (switch) 30. Two wheels 32a are provided on each of two sides opposed to each other in the travel part 24. Two wheels 32b are provided on each of two sides orthogonal to the sides having the wheels 32a and opposed to each other in the travel part 24. The wheels 32a are guided in the guide 10 of the first rail 9 and travel on a travel surface of the first rail 9. The wheels 32b are guided in the guide 12 of the second rail 11 and travel on a travel surface of the second rail 11. The travel motor 34 drives the wheels 32a, 32b. The up and down mechanism 30 moves the wheels 32a, 32b and the travel motor 34 upward and downward. The up and down mechanism 30 is, for example, a pantograph or a cam.

With the upward and downward movement of the wheels 32a, 32b by the up and down mechanism 30, the wheels 32a or the wheels 32b come into contact with the guide 10 of the first rail 9 or the guide 12 of the second rail 11 so that the travel part 24 travels along the first rail 9 or the second rail 11. That is, the up and down mechanism 30 moves the wheels 32a or the wheels 32b upward and downward to switch a traveling state between a first traveling state in which the wheels 32a travel along the first rail 9 and a second traveling state in which the wheels 32b travel along the second rail 11.

The travel part 24 has sensors 36 and barcode readers (detector) 38. The sensors 36 are disposed at the four corners on the bottom surface of the travel part 24. The sensor 36 detects the cross point 14 of the travel rail 4. The travel part 24 stops based on the cross point 14 detected by the sensor 36 such that the center of the travel part 24 is located at the center of the cell 16 of the travel rail 4.

Figure 8:
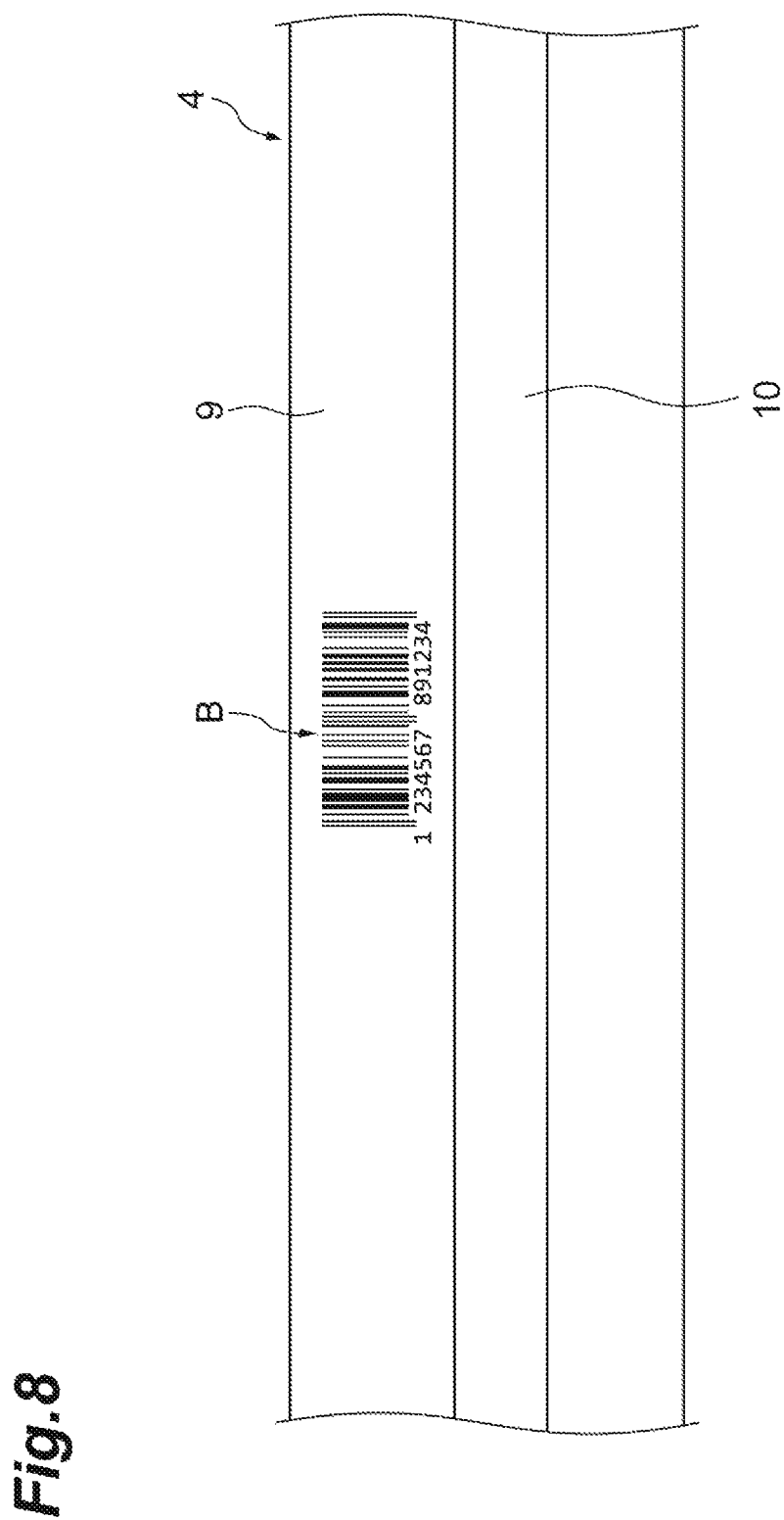
FIG. 8 is a diagram illustrating the travel rail provided with a barcode.

The barcode reader 38 scans a barcode (detection target) B (see FIG. 8). The barcode reader 38 is provided for each travel unit 35 and disposed on the bottom surface of the travel part 24. As illustrated in FIG. 8, the first rail 9 (the second rail 11) is provided with a barcode B. More specifically, the barcode B is disposed at a stop position of the vehicle 8 where the transfer part 26 can be disposed immediately above the first to ninth load ports P1 to P9 of the first to ninth processing devices M1 to M9. The travel part 24 stops at the stop position for the first to ninth load ports P1 to P9, based on the barcode B detected by the barcode reader 38.

The transfer part 26 extends beyond the travel part 24. The transfer part 26 includes a slide fork (movable part) 40, a turning table 44, an elevating device (elevator) 45, an elevating stage 46, and look-down sensors 47 and 48.

Figure 7:
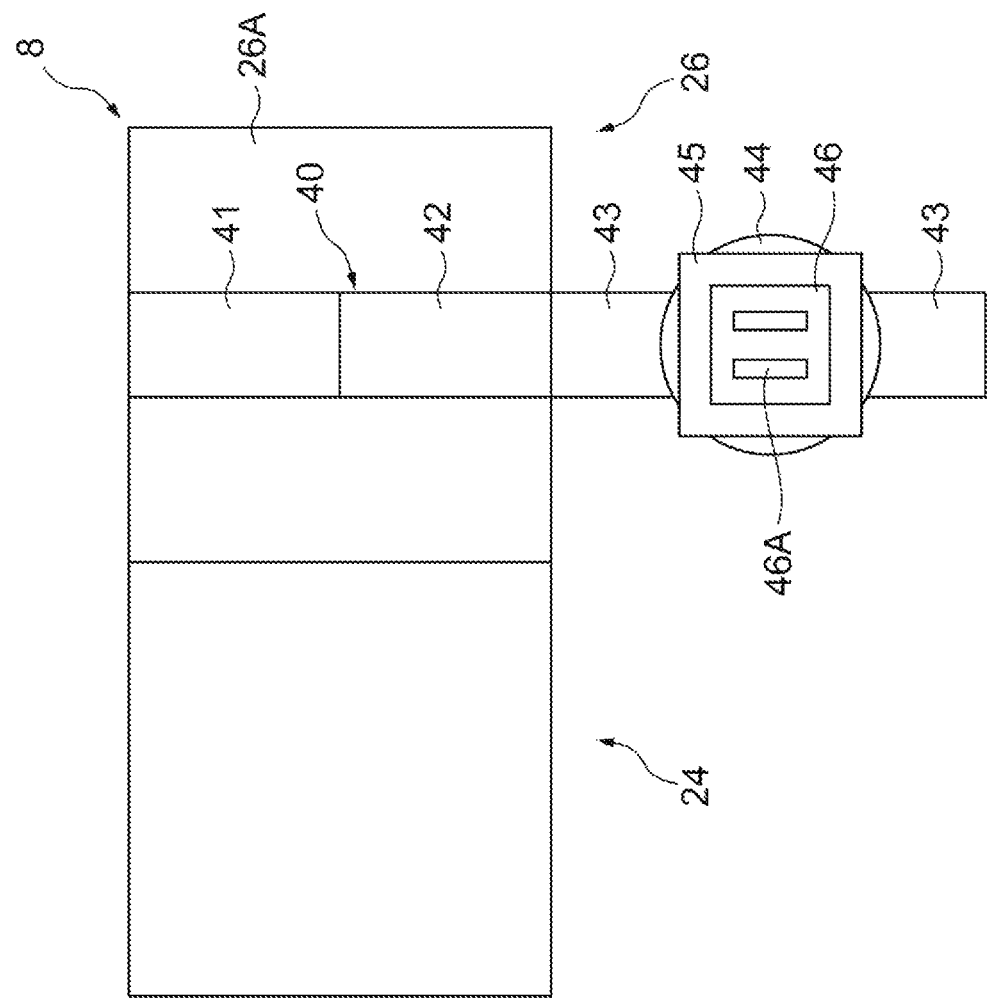
FIG. 7 is a diagram illustrating a transfer part of the vehicle with a slide fork extended.

The slide fork 40 is supported by a support 26A supported on the travel part 24. The slide fork 40 has a base portion 41, a middle portion 42, and a top portion 43. The base portion 41 is provided in the support 26A of the transfer part 26. The slide fork 40 advances and retracts the elevating device 45 in a direction parallel to a plane along the X direction and the Y direction. As illustrated in FIG. 7, the top portion 43 advances on both sides of the transfer part 26, for example, in a stroke equivalent to one side of the cell 16, relative to the base portion 41.

The turning table 44 is provided under the top portion 43. The turning table 44 rotates the elevating device 45 provided under the turning table 44. The turning table 44 is provided to be rotatable, for example, by 180°. The elevating device 45 elevates and lowers the elevating stage 46 through a belt, a rope, a wire and the like. The elevating stage 46 has a gripper (holder) 46A for holding (gripping) the flange 53 of the FOUP 50.

The look-down sensors 47 and 48 detect an object around the elevating stage 46 when the elevating stage 46 is elevated or lowered. The look-down sensors 47 and 48 are disposed at positions in the top portion 43 such that the elevating device 45 is sandwiched therebetween, as illustrated in FIG. 6. Specifically, the look-down sensors 47 and 48 are disposed at positions where the FOUP 50 does not obstruct detection of an object in a state in which the FOUP 50 is held on the elevating stage 46. The transfer part 26 may further include a sensor that detects the presence/absence of a FOUP 50 in the cell buffer 22 and an ID reader that scans, for example, the ID provided on a FOUP 50. The transfer part 26 may further include a sensor that detects an object (obstruction) around the vehicle 8 to avoid contact with the overhead transport vehicle V.

The vehicle 8 has a counter weight 49. The counter weight 49 is provided in the travel part 24. The counter weight 49 has the function of cancelling out moment of force applied from the transfer part 26 to the wheels 32. The counter weight 49 keeps the center of gravity of the vehicle 8 in a range surrounded by a plurality of wheels 32.

The travel rail 4 will now be described in more detail. As illustrated in FIG. 1, the travel rail 4 is provided over the first to ninth processing device groups G1 to G9. The travel rail 4 is disposed across a plurality of processing device groups over the entire area in which the first to ninth processing device groups G1 to G9 are disposed. As a specific example, the travel rail 4 in a grid pattern is provided, for example, across between the first processing device group G1 and the fourth processing device group G4. That is, the travel rail 4 is provided also over the aisle A1 provided between the first processing device group G1 and the fourth processing device group G4.

Figure 9:
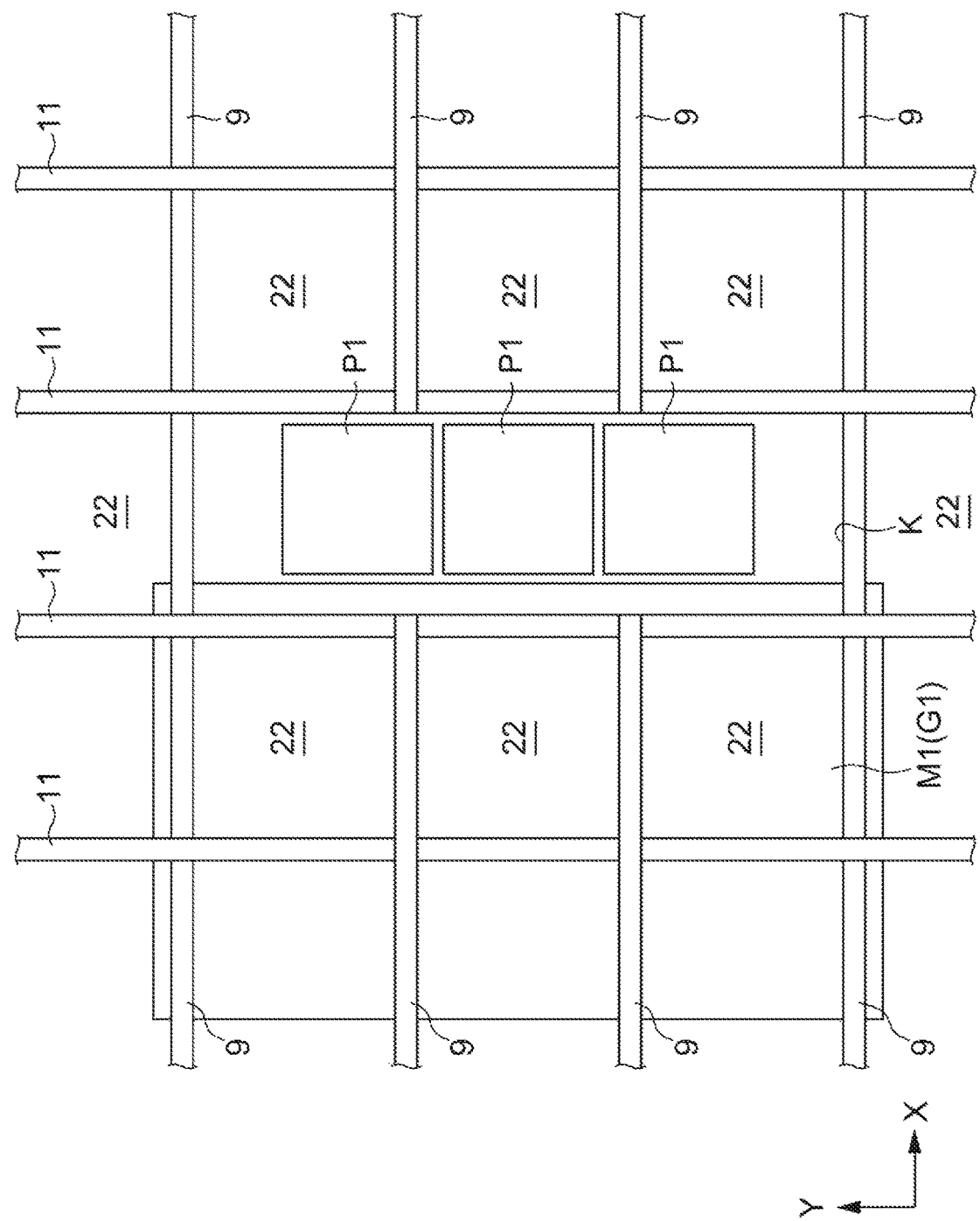
FIG. 9 is a diagram illustrating the travel rail.

As illustrated in FIG. 9, the travel rail 4 is provided with an opening K. In the example illustrated in FIG. 9, the opening K is provided immediately above (vertically above) the first load ports P1 of the first processing device M1. The opening K is a region defined by the first rail 9 and the second rail 11. The opening K makes an opening space above the first load ports P1. In other words, no buffer 6 is provided below the region of the opening K. The opening K is set in a region covering a plurality of (here, three) first load ports P1. The size in the longitudinal direction (the Y direction) of the opening K is larger than the size from one end to the other end of the first load ports P1 in the same direction. The openings K are provided above the first to ninth load ports P1 to P9 of the first to ninth processing devices M1 to M9. When the vehicle 8 conveys a FOUP 50 to the first to ninth load ports P1 to P9, the vehicle 8 stops on at least one of the first rail 9 and the second rail 11 forming the opening K to allow the slide fork 40 to advance and the elevating stage 46 to elevate/lower, thereby conveying the FOUP 50 to the first to ninth load ports P1 to P9 through the opening K.

The cell buffers 22 are provided on both sides in the X direction and on both sides in the Y direction. That is, as illustrated in FIG. 9, the cell buffers 22 are provided to surround the opening K.

Figure 10:
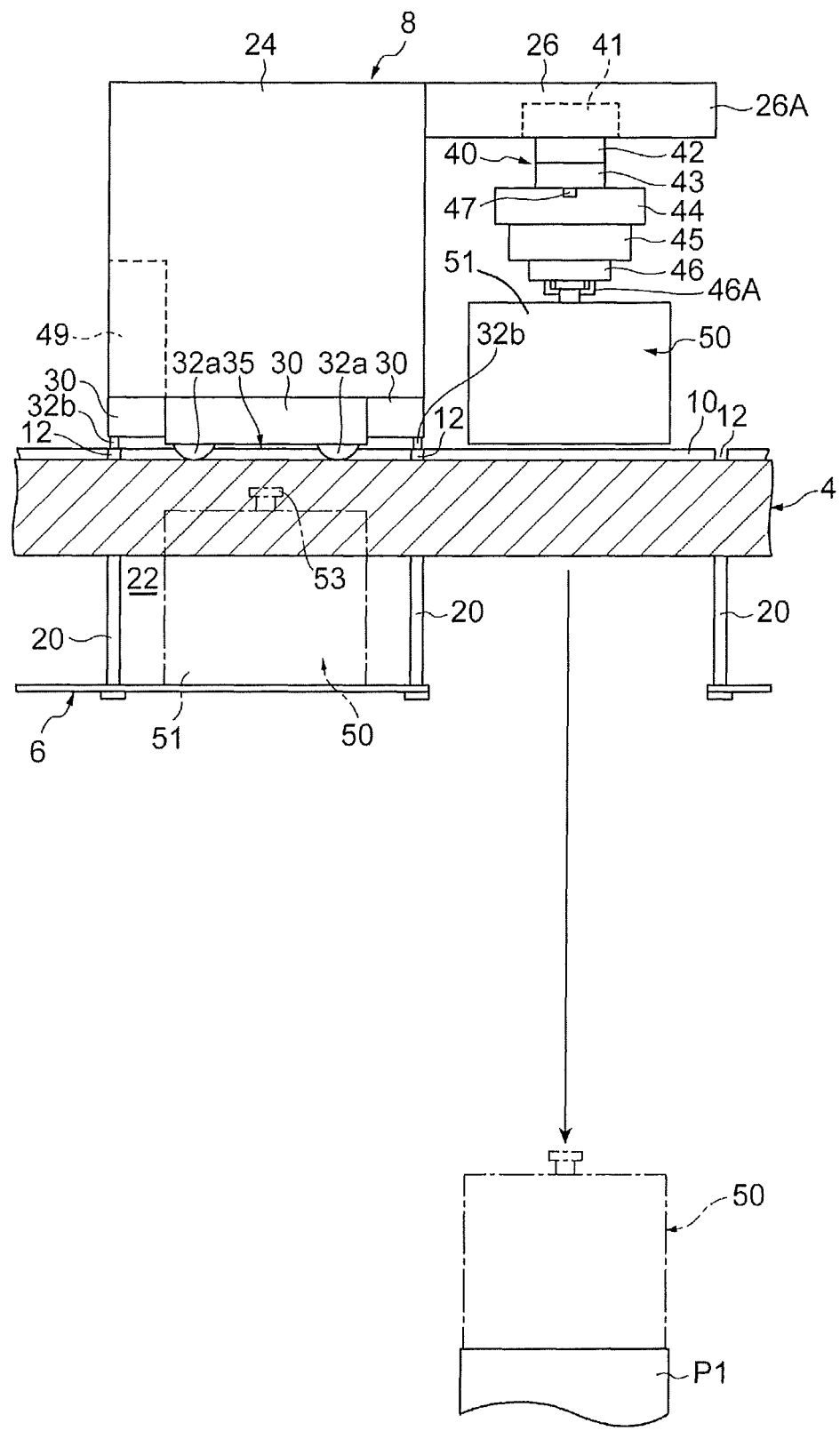
FIG. 10 is a diagram illustrating the vehicle positioned at a stop position where the transfer part is disposed immediately above a load port.

The travel rail 4 is disposed such that the vehicle 8 is accessible to the stop position where the transfer part 26 is disposed immediately above the first to ninth load ports P1 to P9, from the side provided with the cell buffer 22 for the first to ninth load ports P1 to P9 and that the vehicle 8 is accessible to the stop position where the transfer part 26 is disposed immediately above the cell buffer 22. With this configuration, as illustrated in FIG. 10, when a FOUP 50 is transferred from the cell buffer 22 to the first load port P1 by the vehicle 8, the vehicle 8 moves from the side with the cell buffer 22 (left side in the figure) and stops at the second stop position where the transfer part 26 is disposed immediately above the cell buffer 22 to retrieve the FOUP 50 (indicated by a dashed and single-dotted line) from the cell buffer 22 through the cell 16. Subsequently, the vehicle 8 moves from the side with the cell buffer 22 and stops at the first stop position (the position where the vehicle 8 stops in FIG. 10) where the transfer part 26 is disposed immediately above the first load port P1 to transfer the FOUP 50 to the first load port P1.

The operation of the vehicle 8 will now be described in detail with reference to FIGS. 11 to 14. In a manner illustrated in FIGS. 11 to 14, the fourth load port P4 is located slightly closer to the second rail 11 with respect to the center in the region of the opening K, and in a state in which the vehicle 8 stops to the right in the figure of the fourth load port P4, the slide fork 40 moves the transfer part 26 to immediately above the fourth load port P4 to convey the FOUP 50.

Figure 11:
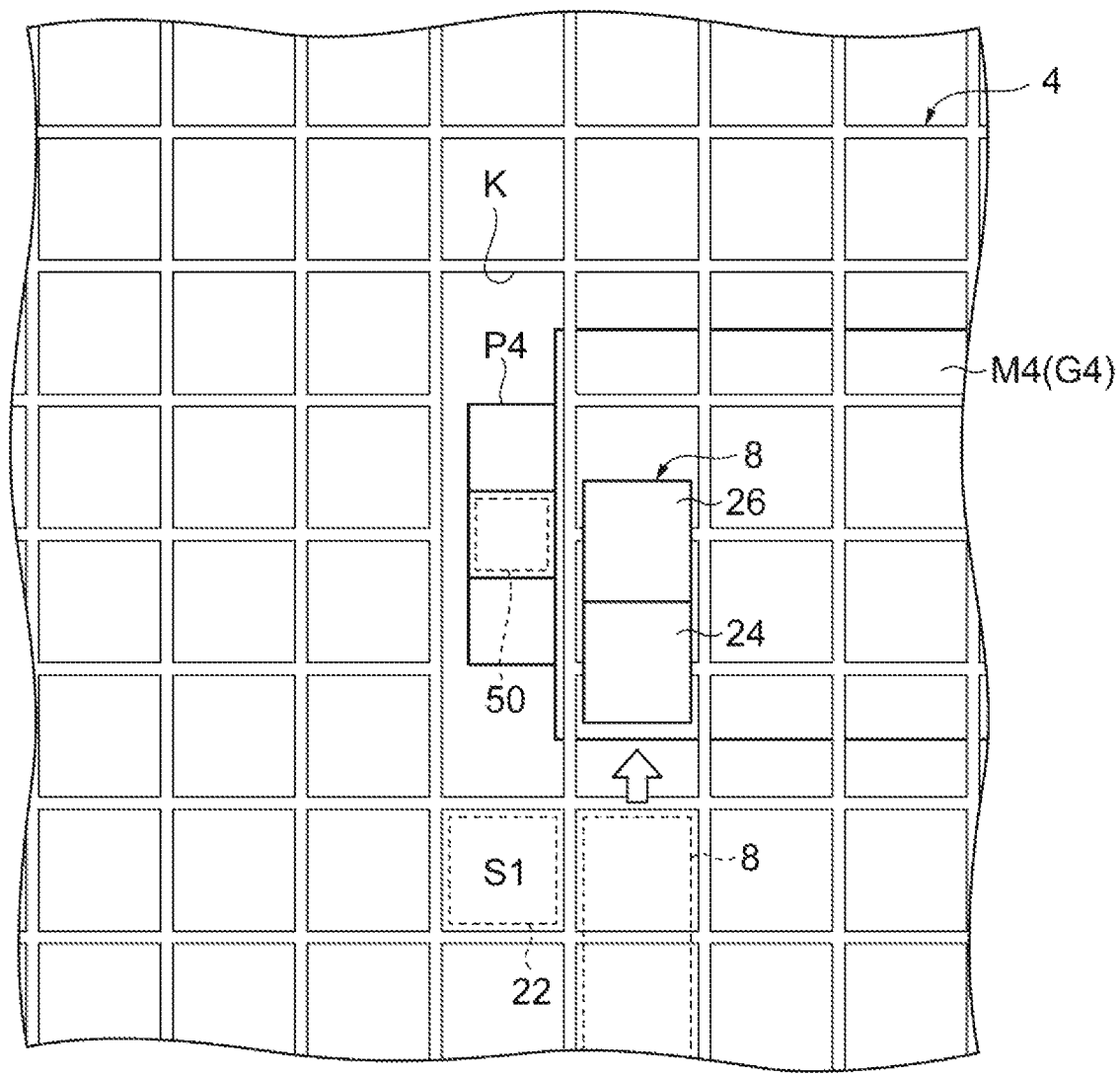
FIG. 11 is a diagram for explaining the operation of the vehicle.

First, as illustrated in FIG. 11, an example in which a FOUP 50 is conveyed from the cell buffer 22 indicated by "S1" to the fourth load port P4 of the fourth processing device M4 in the fourth processing device group G4 is described. As illustrated in FIG. 11, the vehicle 8 stops at the second stop position (the position of the vehicle 8 indicated by a dashed line) where the transfer part 26 is disposed immediately above the cell buffer 22 and picks up the FOUP 50. Upon picking up the FOUP 50, the vehicle 8 moves to the upper side in the figure along the Y direction, moves from the side with the cell buffer 22 for the fourth load port P4 and stops at the first stop position (the position of the vehicle 8 indicated by a solid line) where the transfer part 26 is disposed immediately above the fourth load port P4 to convey the FOUP 50 to the fourth load port P4. As described above, the vehicle 8 conveys the FOUP 50 from the cell buffer 22 to the fourth load port P4.

Figure 12:
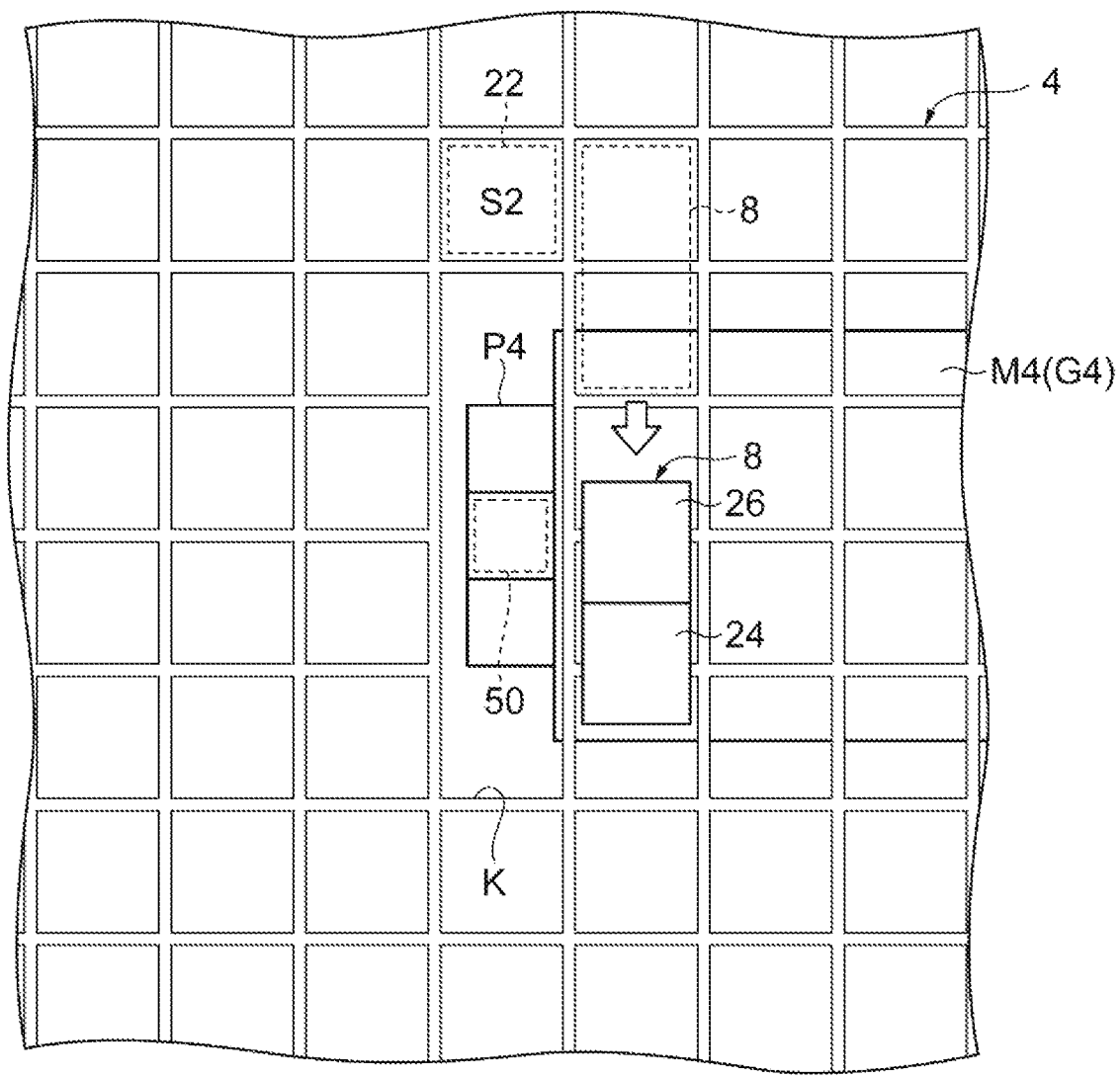
FIG. 12 is a diagram for explaining the operation of the vehicle.

Next, as illustrated in FIG. 12, an example in which a FOUP 50 is conveyed from the cell buffer 22 indicated by "S2" to the fourth load port P4 of the fourth processing device M4 in the fourth processing device group G4 is described. As illustrated in FIG. 12, the vehicle 8 stops at the second stop position (the position of the vehicle 8 indicated by a dashed line) where the transfer part 26 is disposed immediately above the cell buffer 22 and picks up the FOUP 50. Upon picking up the FOUP 50, the vehicle 8 moves to the lower side in the figure along the Y direction, moves from the side with the cell buffer 22 for the fourth load port P4 and stops at the first stop position (the position of the vehicle 8 indicated by a solid line) where the transfer part 26 is disposed immediately above the fourth load port P4 to convey the FOUP 50 to the fourth load port P4. As described above, the vehicle 8 conveys the FOUP 50 from the cell buffer 22 to the fourth load port P4.

Figure 13:
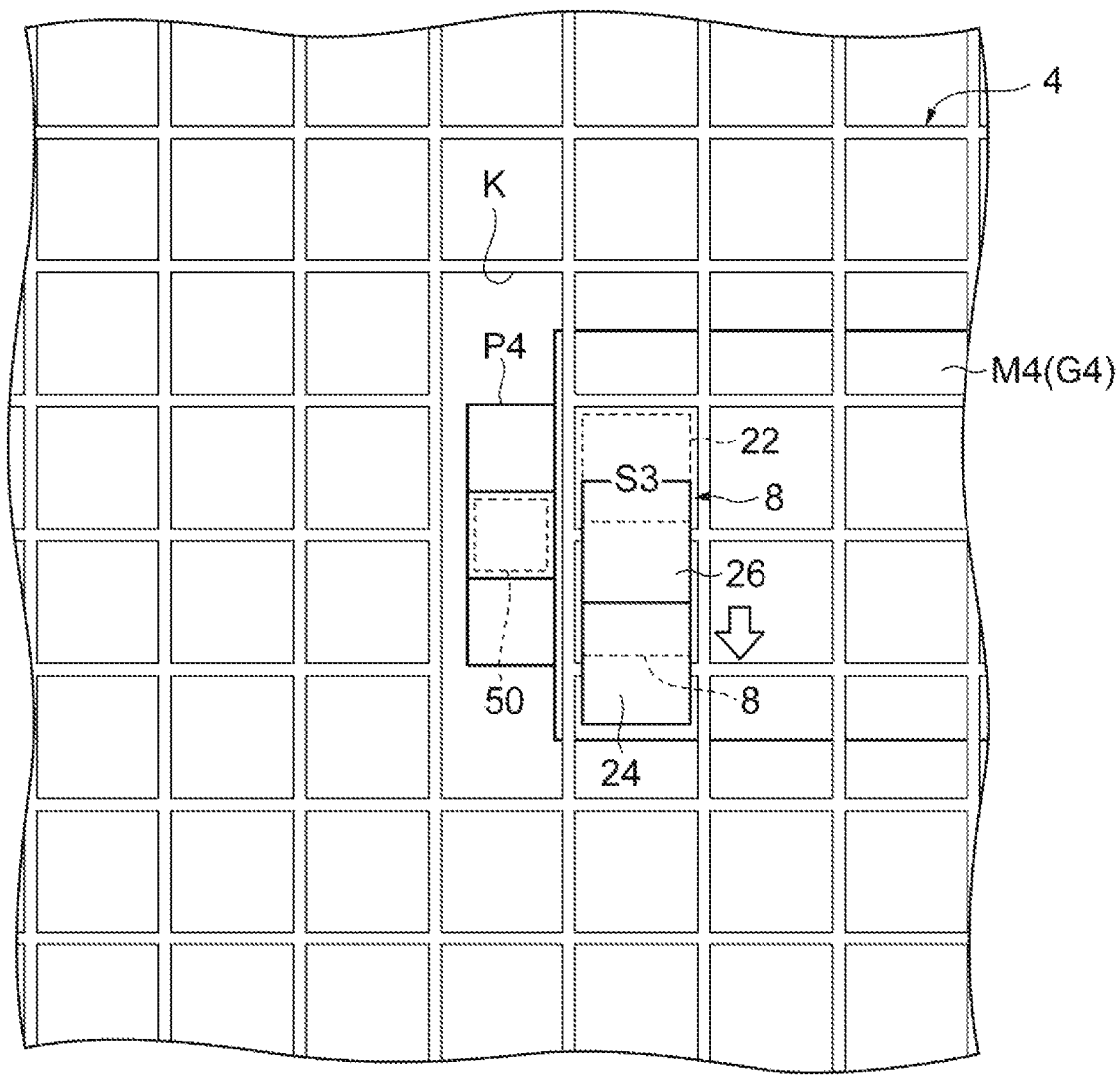
FIG. 13 is a diagram for explaining the operation of the vehicle.

Next, as illustrated in FIG. 13, an example in which a FOUP 50 is conveyed from the cell buffer 22 indicated by "S3" to the fourth load port P4 of the fourth processing device M4 in the fourth processing device group G4 will be described. As illustrated in FIG. 13, the vehicle 8 stops at the second stop position (the position of the vehicle 8 indicated by a dashed line) where the transfer part 26 is disposed immediately above the cell buffer 22 and picks up the FOUP 50. Upon picking up the FOUP 50, the vehicle 8 moves to the lower side in the figure along the Y direction, moves to and stops at the first stop position (the position of the vehicle 8 indicated by a solid line) where the transfer part 26 is disposed immediately above the fourth load port P4, and transfers the FOUP 50 to the fourth load port P4. As described above, the vehicle 8 conveys the FOUP 50 from the cell buffer 22 to the fourth load port P4.

Figure 14:
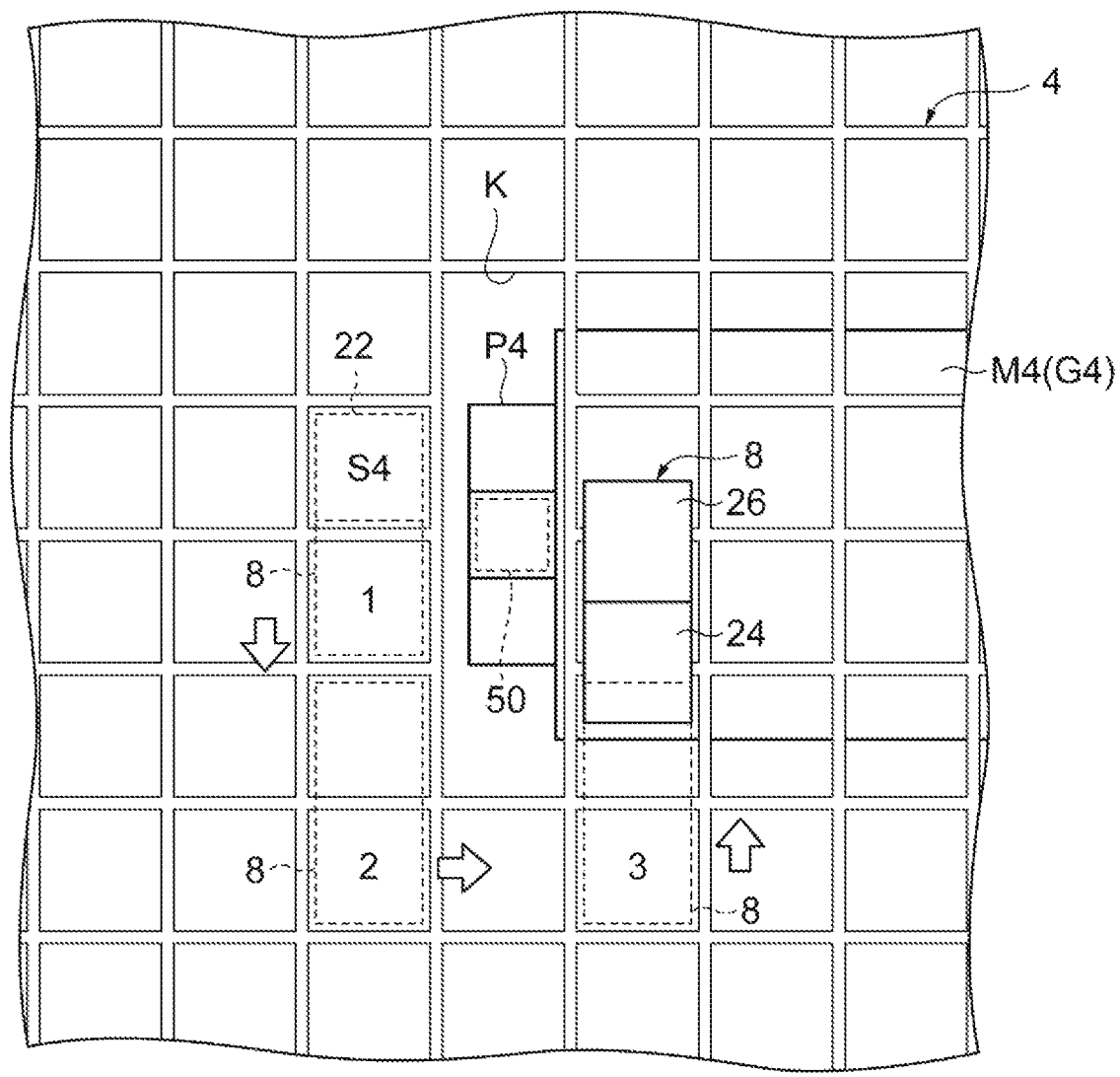
FIG. 14 is a diagram for explaining the operation of the vehicle.

Next, as illustrated in FIG. 14, an example in which a FOUP 50 is conveyed from the cell buffer 22 indicated by "S4" to the fourth load port P4 of the fourth processing device M4 in the fourth processing device group G4 will be described. As illustrated in FIG. 14, the vehicle 8 stops at the second stop position (the position denoted by "1") where the transfer part 26 is disposed immediately above the cell buffer 22 and picks up the FOUP 50. Upon picking up the FOUP 50, the vehicle 8 moves to the position "2" on the lower side in the figure along the Y direction and thereafter moves to the position denoted by "3" on the right side in the figure along the X direction. The vehicle 8 then moves from the position denoted by "3" and stops at the first stop position where the transfer part 26 is disposed immediately above the fourth load port P4 to transfer the FOUP 50 to the fourth load port P4. As described above, the vehicle 8 conveys the FOUP 50 from the cell buffer 22 to the fourth load port P4.

As described above, in the conveyance system 100 according to this example, the travel rail 4 surrounds the first to ninth load ports P1 to P9 to which a FOUP 50 is transferred, in a two-dimensional view. In this configuration, the travel rail 4 includes a rectangular portion that surrounds each of the first to ninth load ports P1 to P9 in a two-dimensional view. The cell buffers 22 storing the FOUPs 50 are provided on at least two sides of this rectangular portion. For example, the cell buffers 22 are provided on four sides of each of the first to ninth load ports P1 to P9 in a two-dimensional view. In this configuration, the travel rail 4 is disposed such that the vehicle 8 is accessible to the first stop position where the transfer part 26 is disposed immediately above the first to ninth load ports P1 to P9 and that the vehicle 8 is accessible to the second stop position where the transfer part 26 is disposed immediately above the cell buffer 22. Thus, in the conveyance system 100, many FOUPs 50 can be temporarily stored at the position from which the vehicle 8 can quickly convey a FOUP 50 to the first to ninth load ports P1 to P9.

The travel rail 4 may be provided to enable access to the first stop position from the side with the cell buffer 22 for the first to ninth load ports P1 to P9. In this configuration, many FOUPs 50 can be temporarily stored at the position from which the vehicle 8 can quickly convey a FOUP 50 to the first to ninth load ports P1 to P9.

The vehicle 8 may travel on the travel rail with the transfer part 26 positioned above the travel rail 4. The travel rail 4 has an opening K in a region covering each of the first to ninth load ports P1 to P9 in a two-dimensional view. The vehicle 8 transfers the FOUP 50 to the first to ninth load ports P1 to P9 using the transfer part 26 through the opening K. Thus, in the configuration of the vehicle 8 traveling on the travel rail 4 with the transfer part 26 positioned above the travel rail 4, the vehicle 8 can transfer the FOUP 50 to the first to ninth load ports P1 to P9 even when the travel rail 4 is provided to surround the first to ninth load ports P1 to P9 in a two-dimensional view.

The travel rail 4 may include a plurality of first rails 9 and a plurality of second rails 11 that are respectively disposed with spacing to enable the FOUP 50 to pass through in the vertical direction. The cell buffer 22 is provided immediately below the cell 16 defined by the first rail 9 and the second rail 11. The vehicle 8 transfers the FOUP 50 to the cell buffer 22 through the cell 16 using the transfer part 26. In this configuration of the vehicle 8 traveling on the travel rail 4 with the transfer part 26 positioned above the travel rail 4, many FOUPs 50 can be stored at a position that does not obstruct traveling of the vehicle 8.

The cell buffers 22 may be provided above the first to ninth load ports P1 to P9. This configuration can reduce the time taken for the vehicle 8 to transfer the FOUP 50 in the cell buffer 22. As a result, the efficiency of conveying the FOUP 50 can be further improved.

The first to ninth load ports P1 to P9 may be provided at the first to ninth processing devices M1 to M9, and the opening K includes a region covering a plurality of the first to ninth load ports P1 to P9 provided for the first to ninth processing devices M1 to M9. This configuration ensures the degree of freedom of relative position between the travel rail 4 and the first to ninth load ports P1 to P9 in a two-dimensional view.

The transfer part 26 of the vehicle 8 may have the slide fork 40 capable of advancing and retracting the elevating device 45 in a direction parallel to a plane along the X direction and the Y direction. The vehicle 8 stops on at least one of the first rail 9 and the second rail 11 forming the opening K and advances the slide fork 40 to transfer the FOUP 50 to the first to ninth load ports P1 to P9 through the opening K. In this configuration, the region of the opening K can be increased. Accordingly, the degree of freedom of relative position between the travel rail 4 and the first to ninth load ports P1 to P9 in a two-dimensional view can be further ensured.

The travel rail 4 may be provided with the barcode B at the stop position of the vehicle 8 for the first to ninth load ports P1 to P9. The vehicle 8 includes the barcode reader 38 for detecting the barcode B. The travel part 24 of the vehicle 8 stops the vehicle 8 at the stop position, based on the result of detection by the barcode reader 38. In this configuration, the vehicle 8 can be stopped accurately at the stop position for the first to ninth load ports P1 to P9.

The travel part 24 may have the up and down mechanism 30 to switch a traveling state between the first traveling state of traveling along the first rail 9 and the second traveling state of traveling along the second rail 11. This enables the vehicle 8 to travel longitudinally and transversely along the X direction and the Y direction.

Although an example of my systems has been described above, this disclosure is not intended to be limited to the foregoing example.

Although the foregoing example includes the track R and the overhead transport vehicle V, the track R and the overhead transport vehicle V may not be included.

Figure 15:
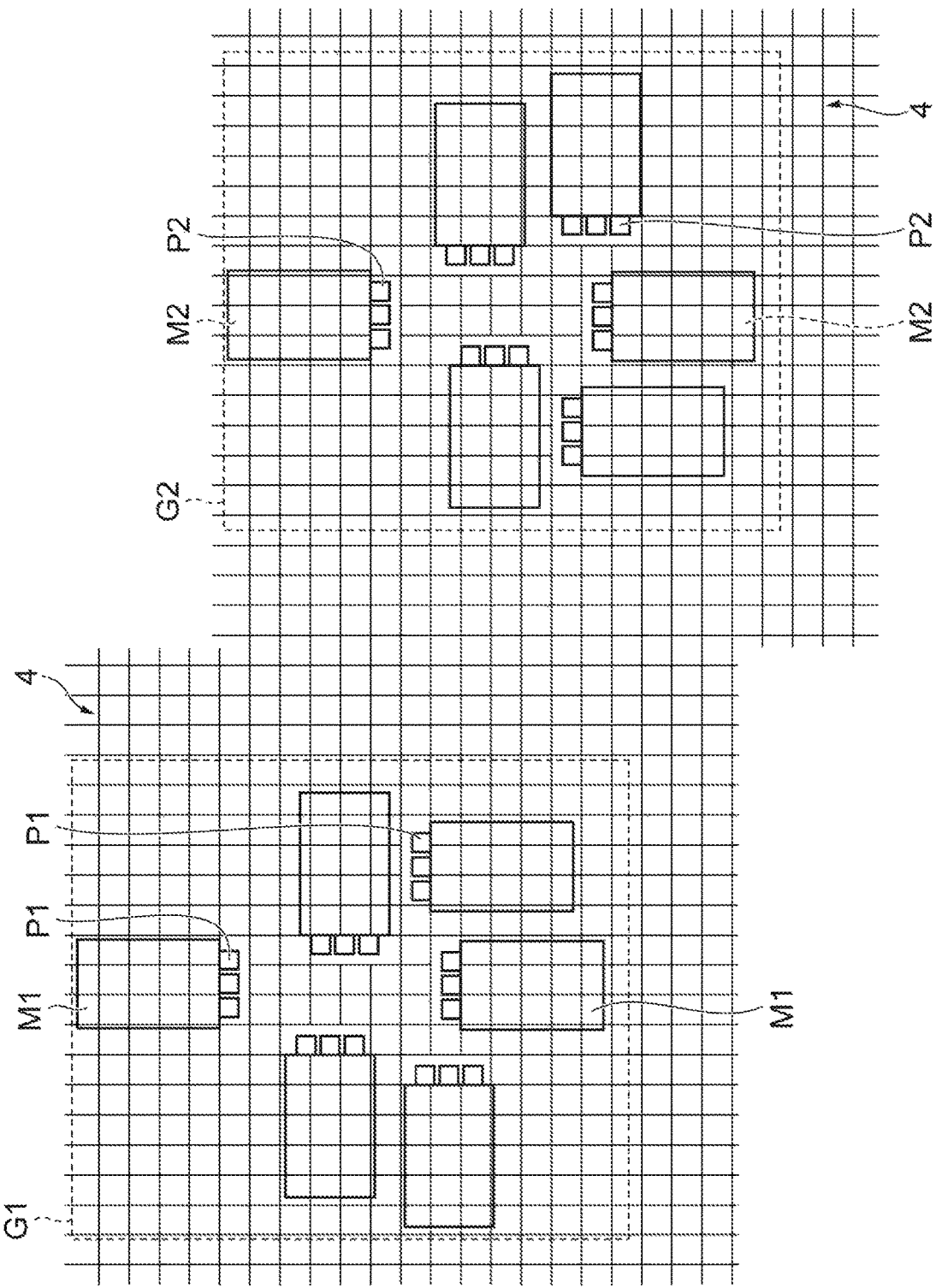
FIG. 15 is a diagram illustrating a travel rail of a conveyance system according to another example.

In the foregoing example, the first to ninth load ports P1 to P9 are disposed along the Y direction. However, the arrangement of the first to ninth load ports P1 to P9 is not limited to this manner. The first to ninth load ports P1 to P9 are set as appropriate depending on the design. For example, as illustrated in FIG. 15, in the first processing device group G1, the first load ports P1 of the first processing devices M1 are disposed along the Y direction or the X direction. The first load ports P1 and the other first load ports P1 are not arranged on a same straight line but are disposed to be shifted in the Y direction or the X direction. Similarly, in the second processing device group G2, the second load ports P2 of the second processing devices M2 are disposed along the Y direction or the X direction. The second load ports P2 and the other second load ports P2 are not arranged on a same straight line but are disposed to be shifted in the Y direction or the X direction. Even with this configuration, in the conveyance system 100, the vehicle 8 can take a plurality of paths with a combination of the X direction and the Y direction in the travel rail 4 and therefore can convey the FOUP 50 efficiently between a plurality of load ports provided non-parallel to each other. This configuration can also increase the degree of freedom of arrangement of the first to ninth load ports P1 to P9 and thus the degree of freedom of arrangement of the first to ninth processing devices M1 to M9.

In the foregoing example, the buffer 6 is provided at a position where part of the FOUP 50 placed on the buffer 6 overlaps the travel rail 4 in a side view. However, the buffer 6 (cell buffer 22) may have a placement surface for the FOUP 50 at the same height as the travel rail 4 or above the travel rail 4.

In the foregoing example, the barcode reader 38 scans the barcode B provided on the travel rail 4. However, the detection target provided on the travel rail 4 may be, for example, a magnetic mark, an optical mark, or a linear scale. Any detector that can detect these detection targets can be employed.

In the foregoing example, the cell buffer 22 accommodates one FOUP 50. However, the cell buffer 22 may accommodate a plurality of FOUPs 50.

In the foregoing example, the transfer part 26 of the vehicle 8 has the slide fork 40. However, the slide fork 40 may be replaced by an arm advancing and retracting in the horizontal direction such as a selective compliance assembly robot arm (SCARA).

Figure 16:
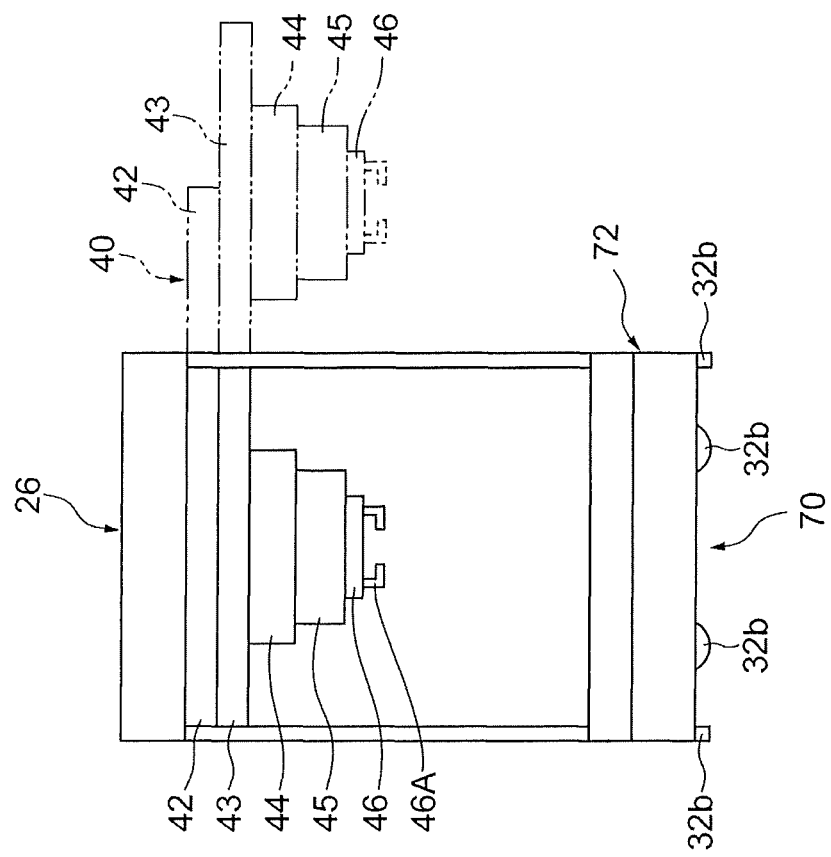
FIG. 16 is a diagram illustrating a vehicle of a conveyance system according to another example.

In the foregoing example, the vehicle 8 includes the travel part 24 and the transfer part 26, and the transfer part 26 extends beyond the travel part 24. However, the vehicle is not limited to this manner. For example, as illustrated in FIG. 16, a vehicle 70 has the slide fork 40 in a travel part 72. The vehicle may be configured such that an arm-shaped transfer part rotates about the center of gravity of the travel part. In this configuration, the transfer part may not have a slide fork.

Figure 17:
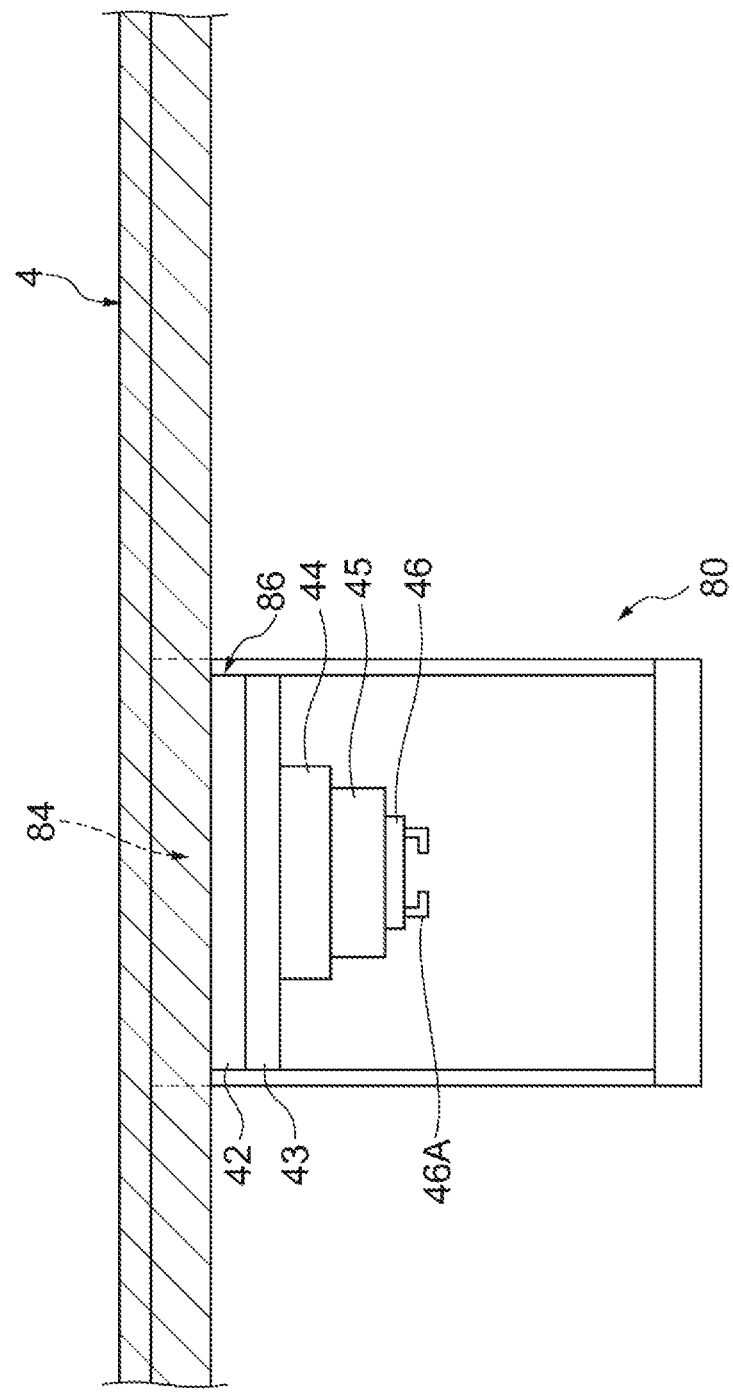
FIG. 17 is a diagram illustrating a vehicle of a conveyance system according to another example.

As illustrated in FIG. 17, a vehicle 80 has a travel part 84 and a transfer part 86. The vehicle 80 may be positioned below the travel rail 4, and the travel part 84 may travel to be suspended from the travel rail 4. In this configuration, the FOUP 50 can be transferred to the first to ninth load ports P1 to P9 without an opening in the travel rail 4. The vehicle may stop immediately above the cell 16 of the travel rail 4 and can convey the FOUP 50 through the cell 16. That is, the transfer part of the vehicle may not have a slide fork. In this configuration, when the FOUP 50 is transferred to the first to ninth load ports P1 to P9, there is no need for advancing the transfer part, enabling quick conveyance of the FOUP 50 to the first to ninth load ports P1 to P9.

In the foregoing example, the travel part 24 of the vehicle 8 includes the up and down mechanism 30. However, the configuration of the switch that switches a traveling state between the first traveling state of traveling along the first rail 9 and the second traveling state of traveling along the second rail 11 is not limited to this manner. A variety of mechanisms can be employed for the switch. For example, the switch may be a mechanism that enables the wheels (travel unit) to move relative to the travel part. In this configuration, the switch allows the wheels to move, whereby the wheels are disposed along the Y direction when the travel part travels along the Y direction whereas the wheels are disposed along the X direction when the travel part travels along the X direction.

Figure 18:
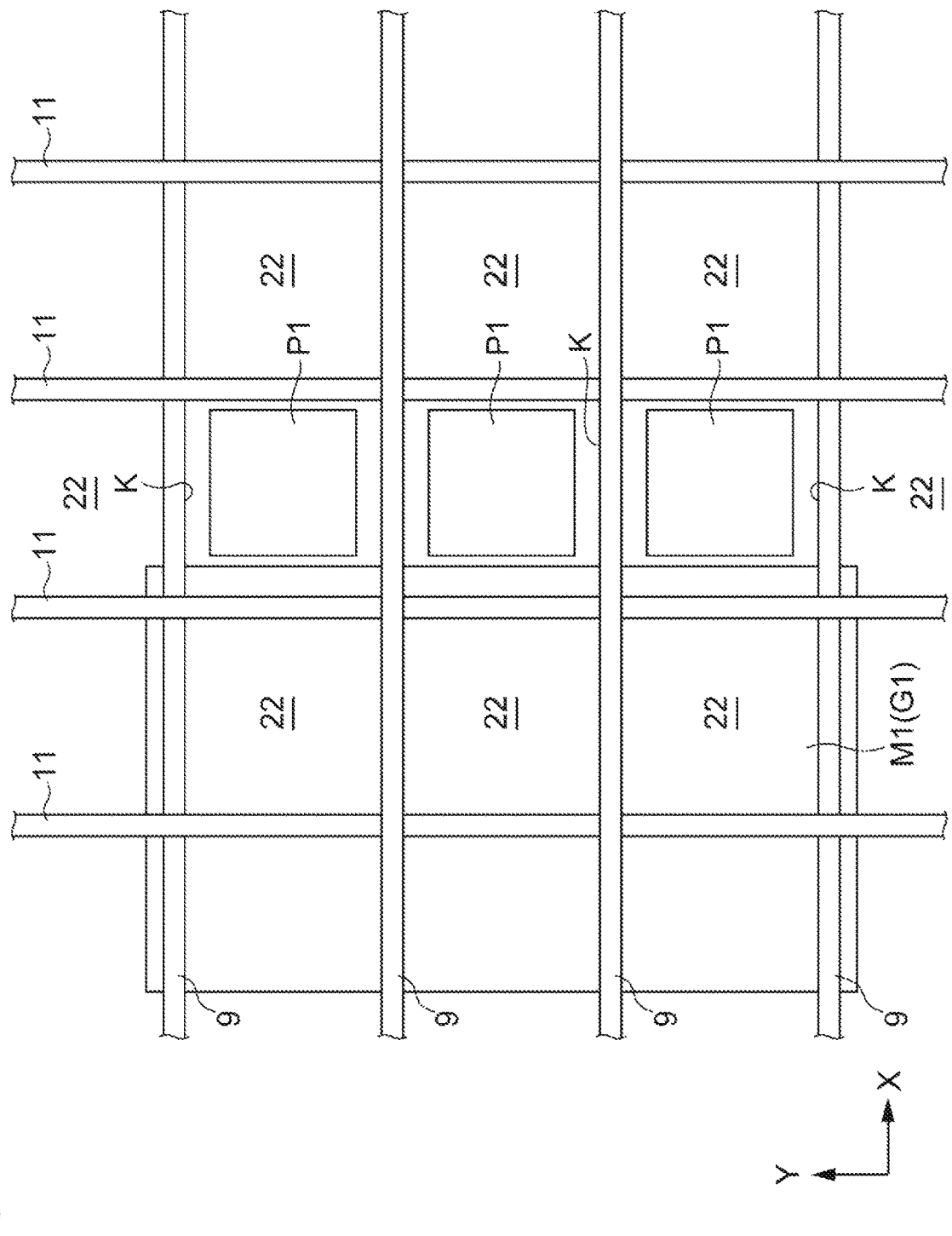
FIG. 18 is a diagram illustrating a travel rail of a conveyance system according to another example.

In the foregoing example, a plurality of load ports are positioned in the region of the opening K provided in the travel rail 4. However, as illustrated in FIG. 18, the opening K may be provided to include one first load port P1 in the region. In this configuration, the vehicle 8 may be positioned over the opening K of the travel rail 4 to convey the FOUP 50 through the opening K. In this configuration, the FOUP 50 can be transferred more quickly to the first to ninth load ports P1 to P9.

Figure 19:
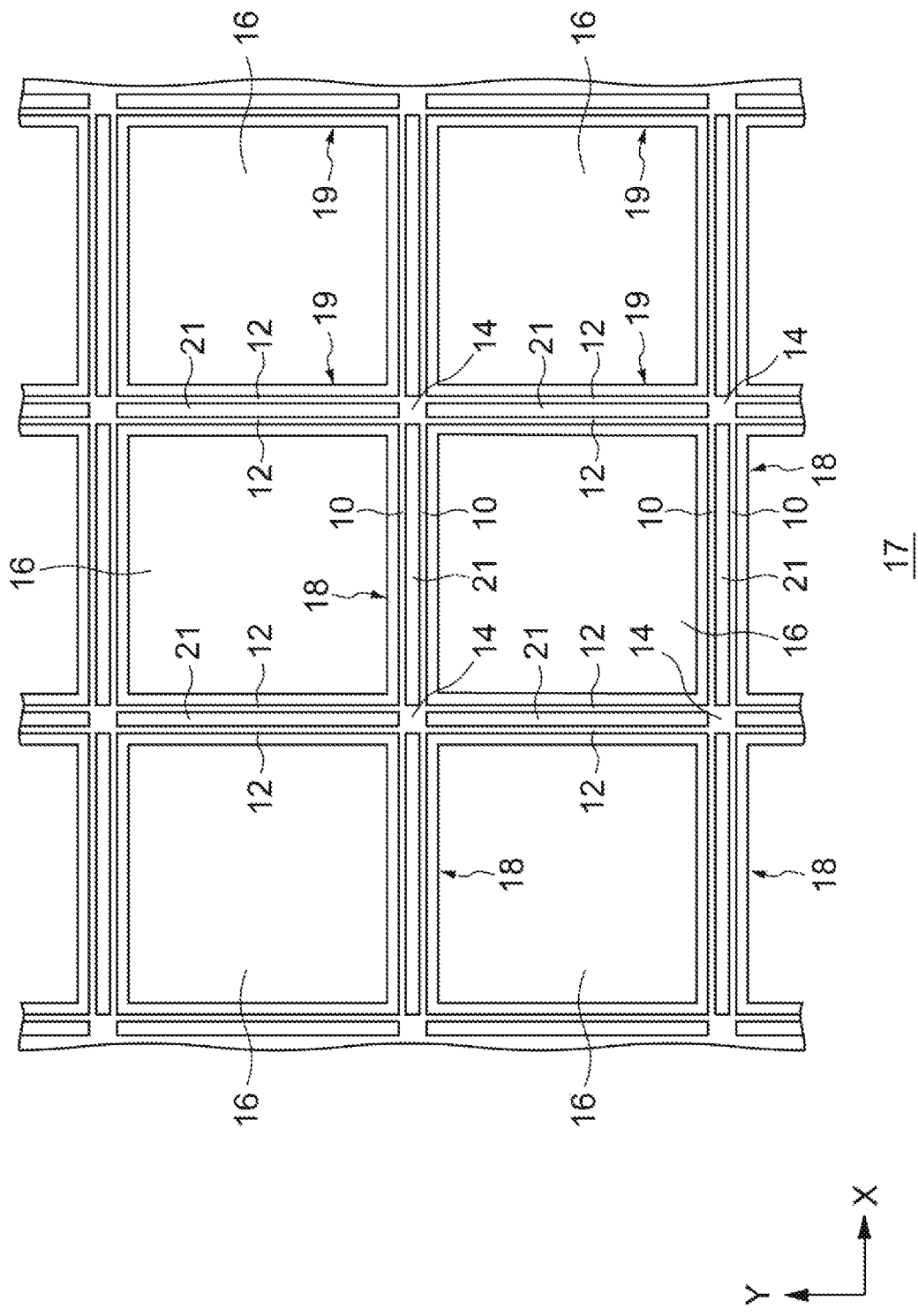
FIG. 19 is a diagram illustrating a travel rail of a conveyance system according to another example.

In the foregoing example, the travel rail 4 is configured with the first rail 9 provided with the guide 10 and the second rail 11 provided with the guide 12. However, the travel rail may be configured, for example, in the manner illustrated in FIG. 19. As illustrated in FIG. 19, a travel rail 17 is configured with a first rail 18 and a second rail 19. The first rail 18 is provided with two guides 10 and 10. The second rail 19 is provided with two guides 12 and 12. Separators are provided between the guide 10 and the guide 10 and between the guide 12 and the guide 12. The separators 21 have a protruding shape and separate the guide 10 from the guide 10 and the guide 12 from the guide 12. In the conveyance system including the travel rail 17, two vehicles 8 can be positioned simultaneously on the first rail 18 or on the second rail 19.

The invention claimed is:

1. A temporary storage system comprising:
   a travel rail having a plurality of first rails extending linearly in a first direction and a plurality of second rails extending in a second direction orthogonal to the first direction, the first rails and the second rails being disposed in a grid pattern on a same plane and disposed to surround a transfer port configured to receive an article when viewed from above the same plane;
   a vehicle having a travel part configured to travel on the travel rail in the first direction and the second direction and a transfer part including a holder configured to hold the article and an elevator configured to elevate and lower the holder; and a plurality of storages each configured to store the article, wherein the travel rail is disposed such that the vehicle is accessible to a first stop position where the transfer part is disposed immediately above the transfer port from a side with the storage for the transfer port and the vehicle is accessible to a second stop position where the transfer part is disposed immediately above the storage, the vehicle travels on the travel rail with the transfer part positioned below the travel rail, the plurality of storages are supported by the travel rail to be suspended therefrom, the transfer part has a turntable configured to rotate the elevator, the vehicle comprises a switching part that enables wheels to move relative to the travel part, and the switching part is configured to switch between a state in which the wheels are aligned in the first direction and a state in which the wheels are aligned in the second direction.

2. The temporary storage system according to claim 1, wherein the transfer part has a movable part configured to advance and retract the elevator in a direction parallel to a plane along the first direction and the second direction, and the vehicle advances the movable part to convey the article to the transfer port.

3. The temporary storage system according to claim 1, wherein the travel rail is provided with a detection target at a stop position of the vehicle for the transfer port, the vehicle includes a detector configured to detect the detection target, and the travel part stops the vehicle at the stop position, based on a result of detection by the detector.

\* \* \* \* \*